(12) United States Patent
Takahashi et al.

(10) Patent No.: US 8,674,368 B2
(45) Date of Patent: Mar. 18, 2014

(54) DISPLAY DEVICE AND METHOD FOR MANUFACTURING THEREOF

(75) Inventors: Kei Takahashi, Isehara (JP); Satoshi Murakami, Atsugi (JP); Suguru Ozawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/432,343

(22) Filed: Mar. 28, 2012

(65) Prior Publication Data

US 2012/0182208 A1 Jul. 19, 2012

Related U.S. Application Data

(62) Division of application No. 12/277,496, filed on Nov. 25, 2008, now Pat. No. 8,148,236.

(30) Foreign Application Priority Data

Nov. 30, 2007 (JP) ................................. 2007-310788

(51) Int. Cl.
 *H01L 27/14* (2006.01)
(52) U.S. Cl.
 USPC ..................... 257/72; 257/59; 257/E33.003
(58) Field of Classification Search
 USPC .................. 257/69, 72, 59, E33.003
 See application file for complete search history.

(56) References Cited

U.S. PATENT DOCUMENTS

| | | | |
|---|---|---|---|
| 5,343,217 A | 8/1994 | Kim | |
| 5,349,366 A | 9/1994 | Yamazaki et al. | |
| 5,583,424 A | 12/1996 | Sato et al. | |
| 5,859,626 A | 1/1999 | Kawamura | |
| 6,087,648 A | 7/2000 | Zhang et al. | |
| 6,335,231 B1 | 1/2002 | Yamazaki et al. | |
| 6,339,422 B1 | 1/2002 | Kuwajima et al. | |
| 6,404,271 B2 | 6/2002 | Ayres | |
| 6,483,484 B1 | 11/2002 | Yamazaki et al. | |
| 6,510,995 B2 | 1/2003 | Muthu et al. | |
| 6,518,962 B2 | 2/2003 | Kimura et al. | |
| 6,522,319 B1 | 2/2003 | Yamazaki | |
| 6,534,380 B1 | 3/2003 | Yamauchi et al. | |
| 6,573,970 B1 | 6/2003 | Saitoh et al. | |
| 6,577,072 B2 | 6/2003 | Saito et al. | |
| 6,618,033 B2 | 9/2003 | Takafuji | |

(Continued)

FOREIGN PATENT DOCUMENTS

| | | |
|---|---|---|
| CN | 1308407 | 8/2001 |
| CN | 1339934 | 3/2002 |

(Continued)

*Primary Examiner* — Kenneth Parker
*Assistant Examiner* — Jose R Diaz
(74) *Attorney, Agent, or Firm* — Eric J. Robinson; Robinson Intellectual Property Law Office, P.C.

(57) ABSTRACT

An object is to provide a system-on-panel display device including a display portion and a peripheral circuit for controlling display on the display portion over one substrate, which can operate more accurately. The display device has a display portion provided with a pixel portion including a plurality of pixels and a peripheral circuit portion for controlling display on the display portion, which are provided over a substrate. Each of the display portion and the peripheral circuit portion includes a plurality of transistors. For semiconductor layers of the transistors, single crystal semiconductor materials are used.

13 Claims, 18 Drawing Sheets

(56) References Cited

U.S. PATENT DOCUMENTS

| | | |
|---|---|---|
| 6,693,412 B2 | 2/2004 | Ruan et al. |
| 6,750,842 B2 | 6/2004 | Yu |
| 6,756,816 B2 | 6/2004 | Miyake |
| 6,803,264 B2 | 10/2004 | Yamazaki et al. |
| 6,872,607 B2 | 3/2005 | Tanaka |
| 6,873,312 B2 | 3/2005 | Matsueda |
| 6,900,788 B2 | 5/2005 | Yamazaki |
| 6,903,377 B2 | 6/2005 | Yamazaki et al. |
| 6,909,240 B2 * | 6/2005 | Osame et al. ............ 315/169.1 |
| 6,909,413 B2 | 6/2005 | Nanno et al. |
| 6,963,323 B2 | 11/2005 | Sakurai et al. |
| 7,002,563 B2 | 2/2006 | Nakamura |
| 7,026,194 B2 | 4/2006 | Suzawa et al. |
| 7,027,074 B2 | 4/2006 | Koyama |
| 7,042,162 B2 | 5/2006 | Yamazaki et al. |
| 7,068,264 B2 | 6/2006 | Tomio et al. |
| 7,084,848 B2 | 8/2006 | Senda et al. |
| 7,106,319 B2 | 9/2006 | Ishiyama |
| 7,115,488 B2 | 10/2006 | Isobe et al. |
| 7,126,161 B2 * | 10/2006 | Yamazaki ..................... 257/98 |
| 7,126,595 B2 | 10/2006 | Yanagi et al. |
| 7,138,975 B2 | 11/2006 | Koyama |
| 7,148,886 B2 | 12/2006 | Nakajima |
| 7,189,994 B2 | 3/2007 | Arao |
| 7,205,989 B2 | 4/2007 | Nakajima |
| 7,205,990 B2 | 4/2007 | Ishiyama |
| 7,232,714 B2 | 6/2007 | Kato et al. |
| 7,259,740 B2 | 8/2007 | Haga et al. |
| 7,330,169 B2 | 2/2008 | Koyama |
| 7,336,273 B2 | 2/2008 | Nakajima |
| 7,362,297 B2 | 4/2008 | Koyama |
| 7,432,529 B2 | 10/2008 | Yamazaki et al. |
| 7,445,946 B2 * | 11/2008 | Yamazaki et al. ............ 438/22 |
| 7,453,428 B2 | 11/2008 | Imajo et al. |
| 7,473,592 B2 | 1/2009 | Yamazaki et al. |
| 7,473,971 B2 | 1/2009 | Yamazaki et al. |
| 7,476,576 B2 | 1/2009 | Yamazaki et al. |
| 7,638,805 B2 | 12/2009 | Yamazaki et al. |
| 7,642,598 B2 | 1/2010 | Yamazaki et al. |
| RE42,097 E | 2/2011 | Yamazaki et al. |
| RE42,139 E | 2/2011 | Yamazaki et al. |
| RE42,241 E | 3/2011 | Yamazaki et al. |
| 2002/0057235 A1 | 5/2002 | Murai et al. |
| 2003/0058543 A1 | 3/2003 | Sheedy et al. |
| 2003/0089905 A1 | 5/2003 | Udagawa et al. |
| 2005/0041002 A1 | 2/2005 | Takahara et al. |
| 2005/0173709 A1 | 8/2005 | Lee et al. |
| 2006/0187172 A1 | 8/2006 | Nakajima |
| 2007/0002084 A1 | 1/2007 | Kimura et al. |
| 2008/0054269 A1 | 3/2008 | Yamazaki et al. |
| 2008/0070335 A1 | 3/2008 | Yamazaki et al. |
| 2009/0114926 A1 | 5/2009 | Yamazaki |
| 2009/0236698 A1 | 9/2009 | Yamazaki et al. |

FOREIGN PATENT DOCUMENTS

| | | |
|---|---|---|
| EP | 0 923 067 | 6/1999 |
| EP | 1 304 791 | 4/2003 |
| EP | 1 376 529 | 1/2004 |
| EP | 1 180 762 | 6/2005 |
| JP | 11-097379 A | 4/1999 |
| JP | 11-202290 | 7/1999 |
| JP | 2001-196566 A | 7/2001 |
| JP | 2002-175049 | 6/2002 |
| JP | 2002-348198 A | 12/2002 |
| JP | 2004-047410 A | 2/2004 |
| JP | 2004-146082 | 5/2004 |
| JP | 2004-153255 A | 5/2004 |
| JP | 2005-252244 A | 9/2005 |
| JP | 2007-158371 A | 6/2007 |
| JP | 2007-165923 A | 6/2007 |
| WO | WO 02/35507 | 5/2002 |

* cited by examiner

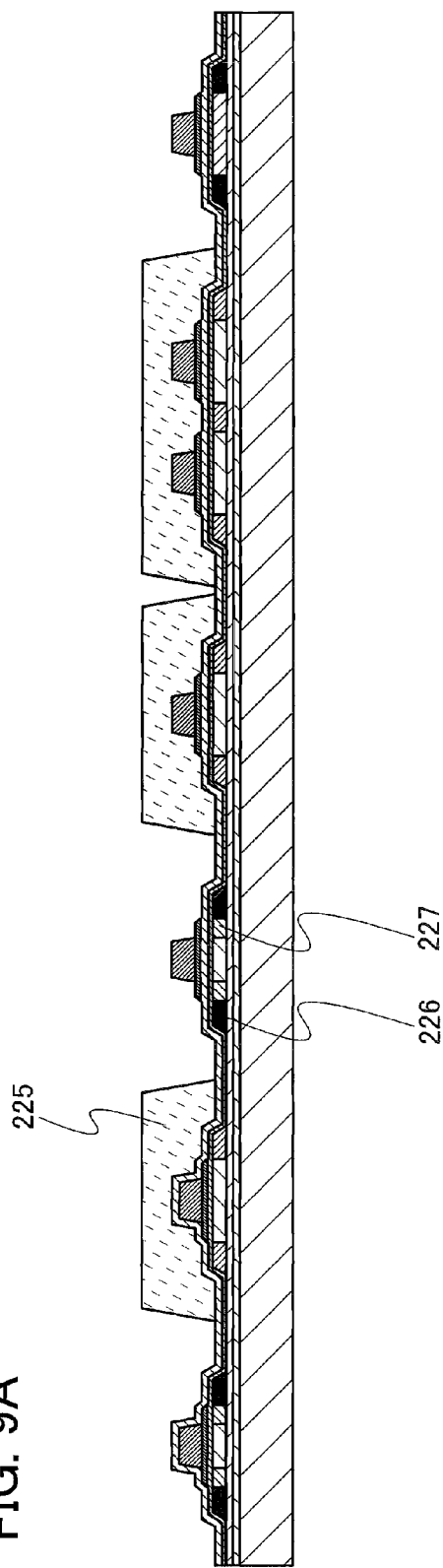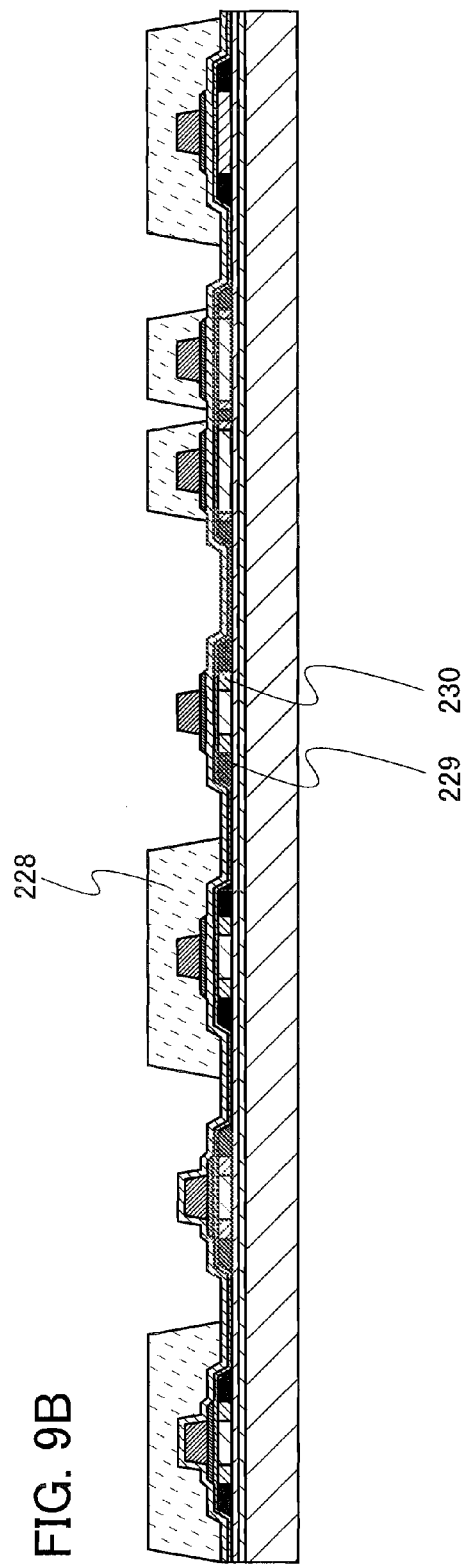

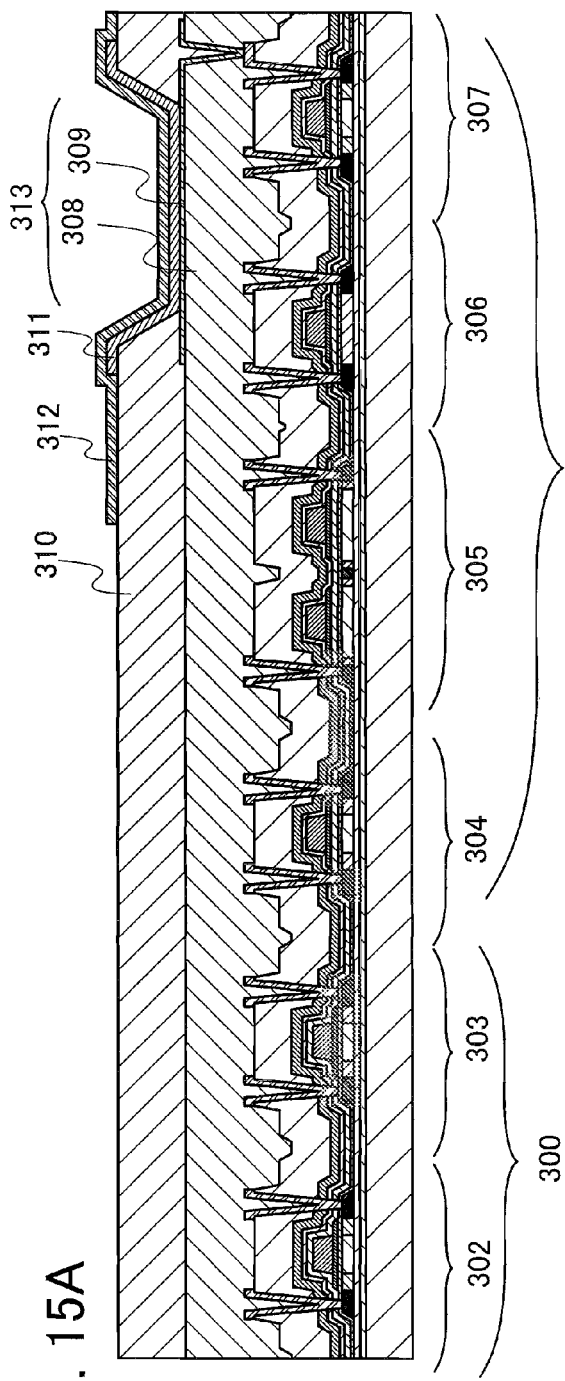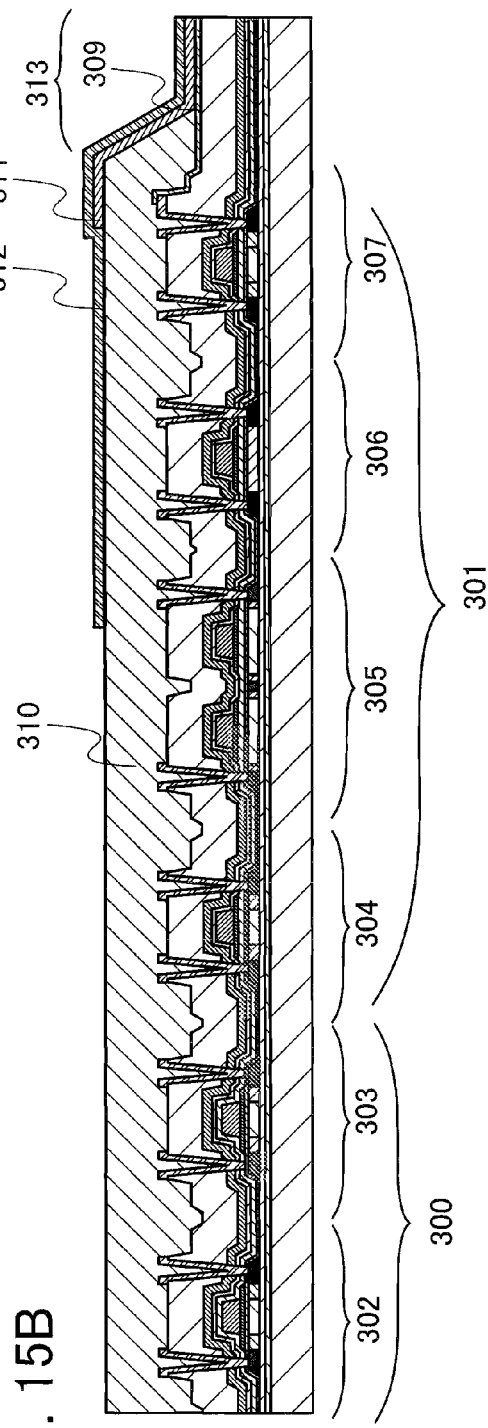

DISPLAY DEVICE AND METHOD FOR MANUFACTURING THEREOF

BACKGROUND OF THE INVENTION

1. Field of the Invention

The present invention relates to a display device and a method for manufacturing the display device. The present invention also relates to an electronic appliance having a display panel using the display device.

2. Description of the Related Art

In recent years, as display devices such as liquid crystal display devices and electroluminescent display devices (hereinafter referred to as EL display devices), display devices each having the structure (hereinafter referred to as a system-on-panel type) in which a display portion including a pixel portion and a driver circuit for driving the pixel portion, a circuit group (hereinafter referred to as a peripheral circuit portion) provided for operating the display portion, such as an arithmetic circuit or a memory circuit, are formed over one substrate have been known. In each of these system-on-panel display devices, as transistors included in circuits of a display portion and a peripheral circuit portion, transistors using polycrystalline semiconductor materials for semiconductor layers have been known, for example.

A polycrystalline semiconductor material has higher field effect mobility than an amorphous semiconductor material such as amorphous silicon. Further, with a polycrystalline semiconductor material, not only an n-channel transistor but a p-channel transistor can be formed. Thus, with a polycrystalline semiconductor material, a CMOS circuit can be formed and a polycrystalline semiconductor material is more preferably applied to not only a semiconductor layer of a transistor included in a circuit in a display portion but a semiconductor layer of a transistor included in a circuit required to be operated at high speed, such as an arithmetic circuit, in a peripheral circuit portion, than an amorphous semiconductor material.

As an example of a display device in which a display portion and a peripheral circuit portion are formed over one substrate with the use of such a polycrystalline semiconductor material, Patent Document 1 (Japanese Published Patent Application No. 2004-146082) and the like are given. Patent Document 1 discloses an example of an EL display device in which a display portion, an arithmetic circuit for a peripheral circuit portion, and a booster circuit are formed over one substrate.

SUMMARY OF THE INVENTION

However, in the case of a transistor in which a semiconductor layer is formed using a polycrystalline semiconductor material such as polysilicon, electrical characteristics thereof are likely to vary due to a defect in a crystal grain boundary. When characteristics such as mobility and the threshold of transistors included in the display portion and the peripheral circuit portion vary, there occurs a problem that the amounts of drain current vary among transistors even in the case where the same signal is supplied to the transistors. Therefore, for example, in the case of a system-on-panel EL display device in which a display portion and a peripheral circuit portion are formed by forming transistors with the use of polycrystalline semiconductor materials, luminance of light-emitting elements in pixels vary among the pixels, which leads to, for example, display unevenness. Thus, it is difficult to perform display accurately.

Further, in the above display device, there are problems in that a high driving voltage is required, and as disclosed in Patent Document 1, a booster circuit such as a charge pump is required so that the circuit dimension is increased.

In view of the above problems, an object of the present invention is to provide a system-on-panel display device in which variations among pixels are suppressed so that more accurate display can be performed.

Further, another object of the present invention is to provide a display device in which a display portion and a peripheral circuit portion are formed over one substrate, to which a desired voltage can be applied without a circuit such as a booster circuit.

An aspect of the present invention is a display device including a display portion and a peripheral circuit portion which are formed using single crystal semiconductor materials, over one substrate.

In more specific, an aspect of the present invention is a display device including a substrate; a display portion which is formed over the substrate with the use of a plurality of first transistors each having at least a gate terminal, a source terminal, and a drain terminal; and a peripheral circuit portion for controlling display operation in the display portion, which is formed over the substrate provided with the display portion, with the use of a plurality of second transistors each having at least a gate terminal, a source terminal, and a drain terminal, wherein the plurality of first transistors and the plurality of second transistors include semiconductor layers using single crystal semiconductor materials; the display portion has a pixel portion including at least one pixel; the pixel includes a light-emitting element and a driving transistor for controlling the amount of light emitted by the light-emitting element, which is one of the plurality of first transistors; a semiconductor layer of the driving transistor includes a channel region whose channel length direction is parallel to a longitudinal direction of the pixel; and $143 \leq L \leq AX (0 < A \leq 0.7, X \geq 204)$ is satisfied under the condition that the channel length of the driving transistor is L μm and the longitudinal length of the pixel is X μm.

Note that the display device of the present invention may have a structure in which a first gate insulating layer is provided over semiconductor layers of the plurality of second transistors, and the first gate insulating layer and a second gate insulating layer are provided in this order over semiconductor layers of the plurality of first transistors.

Further, in the display device of the present invention, when it is assumed that the voltage applied between the gate terminal and the source terminal of the driving transistor is $V_{gs}$, the voltage applied between the source terminal and the drain terminal is $V_{ds}$, and the threshold voltage of the driving transistor is $V_{th}$, the driving transistor may be driven so that $|V_{ds}|=|V_{gs}|-|V_{th}|$ is satisfied.

Further, in the display device of the present invention, the amount of current flowing through the light-emitting element in one pixel may be larger than or equal to 0.1 μA and smaller than or equal to 1.0 μA.

Further, in the display device of the present invention, the peripheral circuit portion may include an arithmetic circuit, an image processing circuit, and a memory circuit.

Another aspect of the present invention is an electronic appliance having a display panel using the display device described above.

Another aspect of the present invention is a method for manufacturing a display device, which includes a step of forming a plurality of semiconductor layers having island shapes with the use of single crystal semiconductor materials over a substrate with a first insulating layer interposed therebetween; a step of forming a first gate insulating layer over the first insulating layer and the plurality of semiconductor layers; a step of forming a first gate electrode over a semiconductor layer of a transistor included in a peripheral circuit portion for controlling display operation in a display portion of the plurality of semiconductor layers, with the first gate insulating layer interposed therebetween; a step of forming a second gate insulating layer over the first gate electrode and the first gate insulating layer; a step of forming a second gate electrode over a semiconductor layer of a transistor included in the display portion of the plurality of semiconductor layers, with the first gate insulating layer and the second gate insulating layer interposed therebetween; a step of selectively forming a resist mask over the plurality of semiconductor layers with the first gate electrode, the second gate electrode, and the second gate insulating layer interposed therebetween and adding an impurity element imparting p-type conductivity (hereinafter referred to as a p-type impurity element) or an impurity element imparting n-type conductivity (hereinafter referred to as an n-type impurity element), so that first impurity regions and second impurity regions in which impurity concentration is lower than that in the first impurity regions are selectively formed in the plurality of semiconductor layers; a step of removing the resist mask and forming a second insulating layer over the second gate insulating layer and the second gate electrode; a step of selectively forming a plurality of first opening portions in parts of the layers, which are over the first impurity regions; a step of forming a plurality of wirings in contact with the first impurity regions through the plurality of first opening portions; a step of forming a first electrode in contact with any of wirings of a transistor included in the display portion of the plurality of wirings; a step of forming a third insulating layer over the first electrode, the plurality of wirings, and the second insulating layer; a step of selectively forming a second opening portion in part of the third insulating layer, which is over the first electrode; a step of forming an electroluminescent layer in contact with the first electrode through the second opening portion; and a step of forming a second electrode in contact with the electroluminescent layer.

Another aspect of the present invention is a method for manufacturing a display device, which includes a step of forming a plurality of semiconductor layers having island shapes with the use of single crystal semiconductor materials over a substrate with a first insulating layer interposed therebetween; a step of forming a first gate insulating layer over the first insulating layer and the plurality of semiconductor layers; a step of forming a first gate electrode over a semiconductor layer of a transistor included in a peripheral circuit portion of the plurality of semiconductor layers, with the first gate insulating layer interposed therebetween; a step of forming a second gate insulating layer over the first gate electrode and the first gate insulating layer; a step of forming a second gate electrode over a semiconductor layer of a transistor included in a display portion of the plurality of semiconductor layers, with the first gate insulating layer and the second gate insulating layer interposed therebetween; a step of selectively forming a resist mask over the plurality of semiconductor layers with the first gate electrode, the second gate electrode, and the second gate insulating layer interposed therebetween and adding a p-type impurity element or an n-type impurity element, so that first impurity regions and second impurity regions in which impurity concentration is lower than that in the first impurity regions are selectively formed in the plurality of semiconductor layers; a step of removing the resist mask and forming a second insulating layer over the second gate insulating layer and the second gate electrode; a step of selectively forming a plurality of first opening portions in parts of the layers, which are over the first impurity regions; a step of forming a plurality of wirings in contact with the first impurity regions through the plurality of first opening portions; a step of forming a third insulating layer over the plurality of wirings and the second insulating layer; a step of selectively forming a second opening portion in part of the third insulating layer, which is over the plurality of wirings; a step of forming a first electrode in contact with any of wirings of a transistor included in the display portion of the plurality of wirings through the second opening portion; a step of forming a fourth insulating layer over the first electrode and the third insulating layer; a step of selectively forming a third opening portion in the fourth insulating layer; a step of forming an electroluminescent layer in contact with the first electrode through the third opening portion; and a step of forming a second electrode in contact with the electroluminescent layer.

Note that in any of the methods for manufacturing a display device of the present invention, the first gate electrode may be formed by forming a first conductive layer over a semiconductor layer of a transistor included in the peripheral circuit portion of the plurality of semiconductor layers, with the first gate insulating layer interposed therebetween and forming a second conductive layer over the first conductive layer.

Note that in any of the methods for manufacturing a display device of the present invention, in the semiconductor layer of a transistor included in the peripheral circuit portion of the plurality of semiconductor layers, the first impurity regions may be formed in regions over which the first conductive layer is not formed, and the second impurity regions may be formed in regions over which the second conductive layer is not formed with the first conductive layer interposed therebetween and the first conductive layer is formed.

Note that in any of the methods for manufacturing a display device of the present invention, the first insulating layer may be formed by forming a first layer over the substrate with the use of one or more of silicon nitride, silicon nitride oxide, and silicon oxynitride and a second layer over the first layer with the use of silicon oxide containing hydrogen and silicon nitride containing hydrogen, or silicon nitride containing oxygen and hydrogen, silicon oxynitride containing oxygen and hydrogen, and silicon nitride oxide containing oxygen and hydrogen.

Note that the transistor in this document includes at least a gate terminal, a source terminal, and a drain terminal, and the gate terminal refers to part of a gate electrode (including a region which functions as a gate, a conductive layer, a wiring, and the like) or part of a portion which is electrically connected to the gate electrode. The source terminal refers to part of a source electrode (including a region which functions as a source, a conductive layer, a wiring, and the like) or part of a portion which is electrically connected to the source electrode. The drain terminal refers to part of a drain electrode (including a region which functions as a drain, a conductive layer, a wiring, and the like) or part of a portion which is electrically connected to the drain electrode.

Since the source terminal and the drain terminal of the transistor in this document are changed depending on the structure, the operating conditions, or the like of the transistor, it is difficult to define which is a source terminal and which is a drain terminal. Therefore, in this document, one terminal which is arbitrarily selected from a source terminal and a drain terminal is called one of the source terminal and the drain terminal, whereas the other terminal is called the other of the source terminal and the drain terminal.

The capacitor in this document includes at least two electrodes, that is, one electrode and the other electrode. Part or entire of one electrode is called a first terminal, whereas part or entire of the other electrode is called a second terminal.

According to the present invention, a system-on-panel display device in which variations among pixels are suppressed so that more accurate display can be performed can be provided.

Further, in the case of forming a display portion and a peripheral circuit portion over one substrate, a system-on-panel display device, to which a predetermined voltage can be applied without a circuit required additionally such as a booster circuit, can be provided.

BRIEF DESCRIPTION OF THE DRAWINGS

In the accompanying drawings:

FIGS. 9A and 9B are cross-sectional views illustrating the method for manufacturing a transistor included in a display device of the present invention in Embodiment Mode 2;

FIGS. 15A and 15B are cross-sectional views illustrating a method for manufacturing a display device of the present invention in Embodiment mode 3;

DETAILED DESCRIPTION OF THE INVENTION

The embodiment modes and embodiment of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiment modes and embodiment.

Embodiment Mode 1

In this embodiment mode, a structure of a display device of the present invention will be described.

Figure 1:
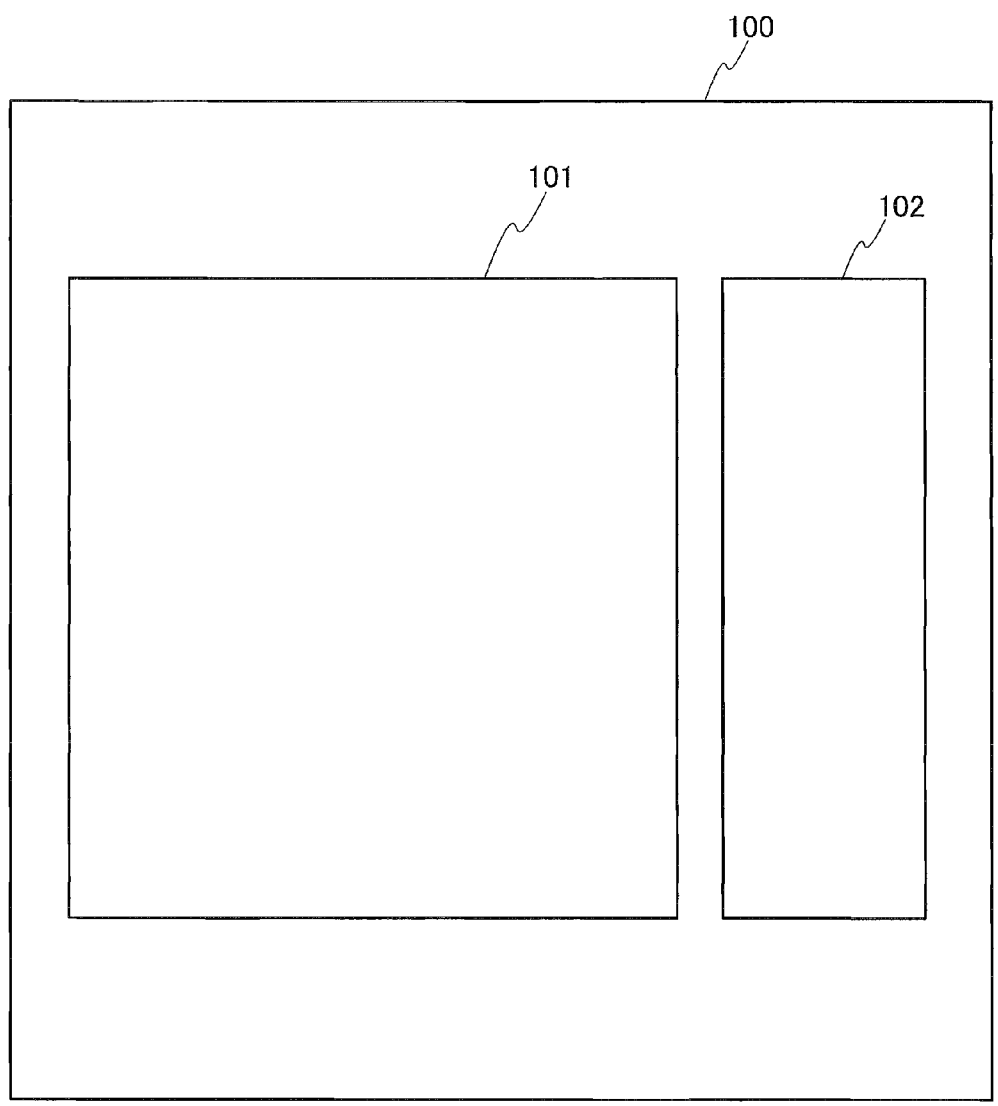
FIG. 1 is a block diagram illustrating a structure of a display device of the present invention in Embodiment Mode 1.

The structure of the display device of the present invention in this embodiment mode will be described with reference to FIG. 1. FIG. 1 is a block diagram illustrating the structure of the display device in this embodiment mode.

The display device of the present invention, which is illustrated in FIG. 1, has a display portion 101 and a peripheral circuit portion 102 which are provided over a substrate 100. The display portion 101 and the peripheral circuit portion 102 are provided over the one substrate.

In the display portion 101, each circuit is formed using a plurality of first transistors each having at least a gate terminal, a source terminal, and a drain terminal. As circuits each formed using the plurality of first transistors, a circuit included in a pixel portion having a display function and a driver circuit for driving a pixel portion are given, for example. As the driver circuit, by being provided with scan lines, signal lines, or the like, a scan line driver circuit for inputting a signal to the pixel portion through the scan lines, a signal line driver circuit for inputting a signal to the pixel portion through the signal lines, or the like may be separately provided. In the case of an EL display device or the like, a power supply line or the like for supplying a current to a light-emitting element, and further, a power supply circuit for giving the power supply line a predetermined potential may be additionally provided.

The peripheral circuit portion 102 has a function of controlling display operation of the display portion 101, in which each circuit is formed using a plurality of second transistors each having at least a gate terminal, a source terminal, and a drain terminal. As circuits each formed using the plurality of second transistors, an image processing circuit, an arithmetic circuit, a memory circuit, a power supply circuit, and the like are given.

As the substrate 100, a glass substrate, a quartz substrate, a ceramic substrate, a plastic substrate, a semiconductor substrate, a sapphire substrate, a metal substrate having a surface subjected to insulation treatment, or the like can be used. The plurality of first transistors and the plurality of second transistors used for the display portion 101 and the peripheral circuit portion 102, respectively, can be formed using a single crystal semiconductor material such as silicon, germanium, or a compound semiconductor such as gallium arsenide or indium phosphide for each semiconductor layer.

Figure 2:
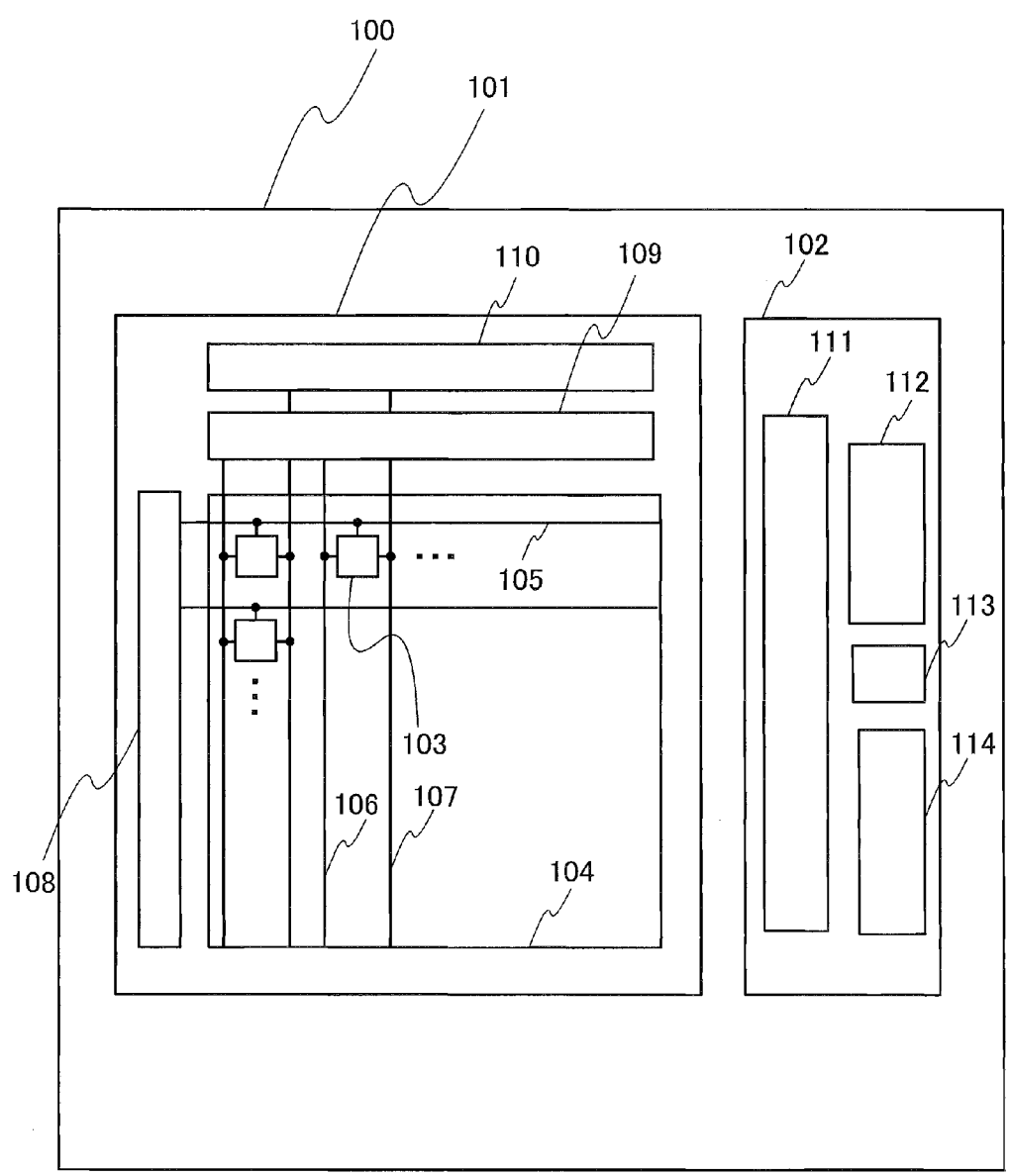
FIG. 2 is a block diagram illustrating a structure of a display device of the present invention in Embodiment Mode 1.

Further, an example of a more specific structure of the display device of the present invention will be described with reference to FIG. 2. FIG. 2 is a block diagram illustrating an example of the structure of the display device in this embodiment mode.

The display device of the present invention, which is illustrated in FIG. 2, has the display portion 101 and the peripheral circuit portion 102 which are provided over the substrate 100. The display portion 101 and the peripheral circuit portion 102 are provided over the one substrate.

As the substrate 100, a glass substrate, a quartz substrate, a ceramic substrate, a plastic substrate, a semiconductor substrate, a sapphire substrate, a metal substrate having a surface subjected to insulation treatment, or the like can be used. The transistors used for the display portion 101 and the peripheral circuit portion 102, can be formed using a single crystal semiconductor material such as silicon, germanium, or a compound semiconductor such as gallium arsenide or indium phosphide for each semiconductor layer.

The display portion 101 includes a pixel portion 104 including a plurality of pixels 103, a scan line 105 electrically connected to the plurality of pixels 103, a signal line 106, a power supply line 107, a scan line driver circuit 108 electrically connected to the scan line 105, a signal line driver circuit 109 electrically connected to the signal line 106, and a power supply circuit 110 electrically connected to the power supply line 107.

The pixel portion 104 has a function of performing display by inputting a signal to a pixel electrically connected to the scan line 105 selected by the scan line driver circuit 108, from the signal line driver circuit 109 through the signal line 106 so that the pixel emits light. Further, the power supply line 107 electrically connected to the power supply circuit 110 is at a predetermined potential.

The peripheral circuit portion 102 includes an image processing circuit 111, an arithmetic circuit 112, a first memory circuit 113, and a second memory circuit 114.

The image processing circuit 111 has a function of processing data input from an external device through an interface or the like to read or write the data from or to an external memory (such as a frame memory) as needed. Further, the image processing circuit 111 has a function of writing an image to be displayed on the display portion 101 to the external memory (such as a frame memory) and outputting the written data to the scan line driver circuit 108 and the signal line driver circuit 109.

The first memory circuit 113 is used for a data memory. For the first memory circuit 113, a WRAM such as an SRAM or a DRAM can be used. The second memory circuit 114 is used for a frame memory. For the second memory circuit 114, a PROM such as a mask ROM can be used.

Figure 3:
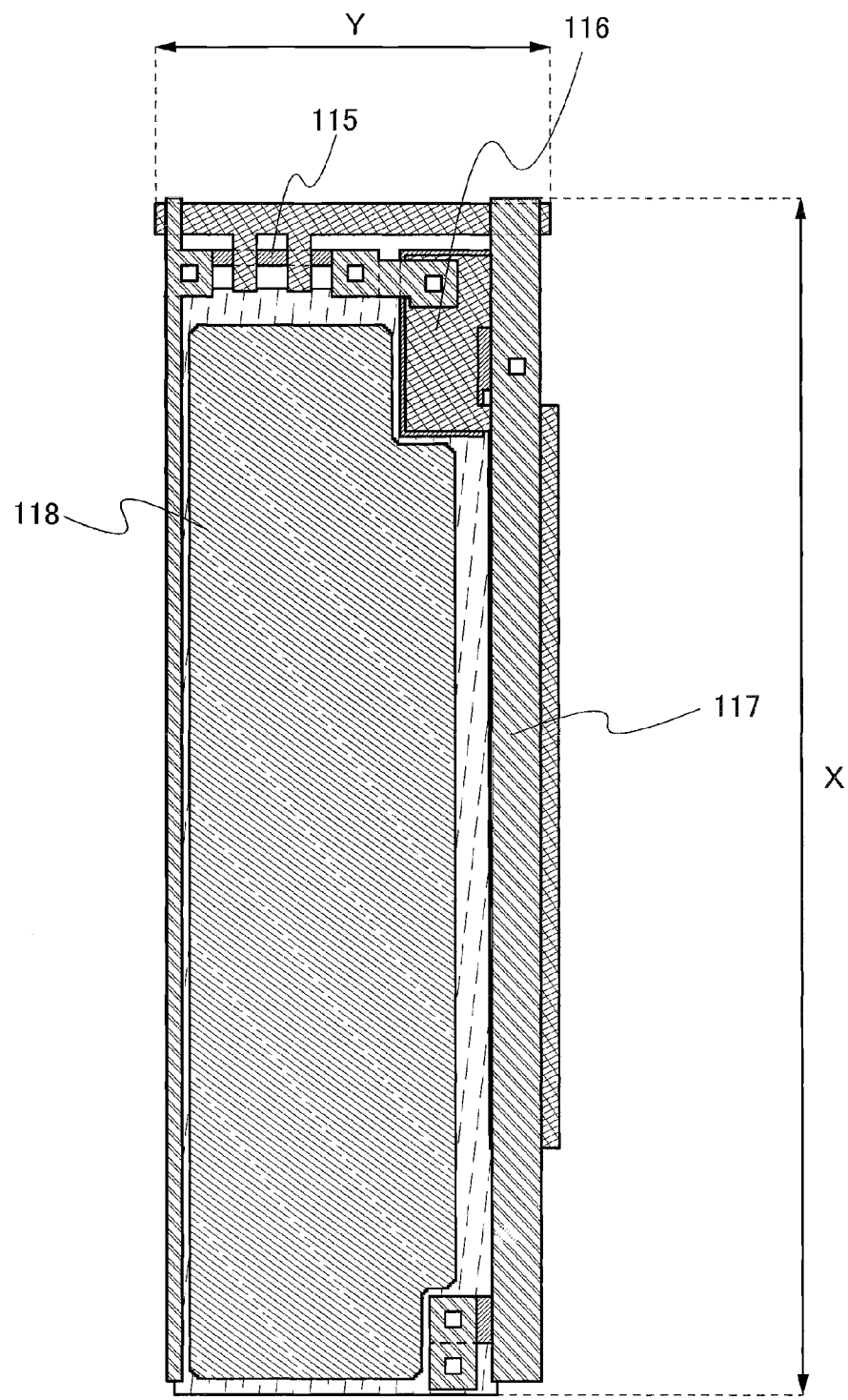
FIG. 3 is a top plan view illustrating a pixel structure of a display device of the present invention in Embodiment Mode 1.

Next, an example of the structure of the pixel of the display device in this embodiment mode will be described with reference to FIGS. 3 and 4. FIG. 3 is a top plan view illustrating an example of the structure of the pixel of the display device of the present invention in this embodiment mode and FIG. 4 is a circuit diagram illustrating an example of the structure of the pixel of the display device of the present invention in this embodiment mode.

The pixel illustrated in FIG. 3 includes a switching transistor 115, a capacitor 116, a driving transistor 117, and a light-emitting element 118.

The pixel in the top plan view is formed of a region surrounded by first opposite sides parallel to each other and second opposite sides parallel to each other, which intersect with the first opposite sides. For example, a quadrangular area having the first opposite sides parallel to the signal line 106 in FIG. 2 and the second opposite sides parallel to the scan line 105 in FIG. 2 can form the pixel. In this document, it is assumed that the direction of longer opposite sides of the first opposite sides and the second opposite sides is a longitudinal direction, the direction of shorter opposite sides is a lateral direction, the side length of a longitudinal direction is a longitudinal length, and the side length of a lateral direction is a lateral length. In the pixel in FIG. 3, it is assumed that X denotes a longitudinal length and Y denotes a lateral length. Further, in the case where the length of the first opposite sides is equal to that of the second opposite sides, one of the length of the first opposite sides and the length of the second opposite sides is a longitudinal length and the other is a lateral length.

Figure 4:
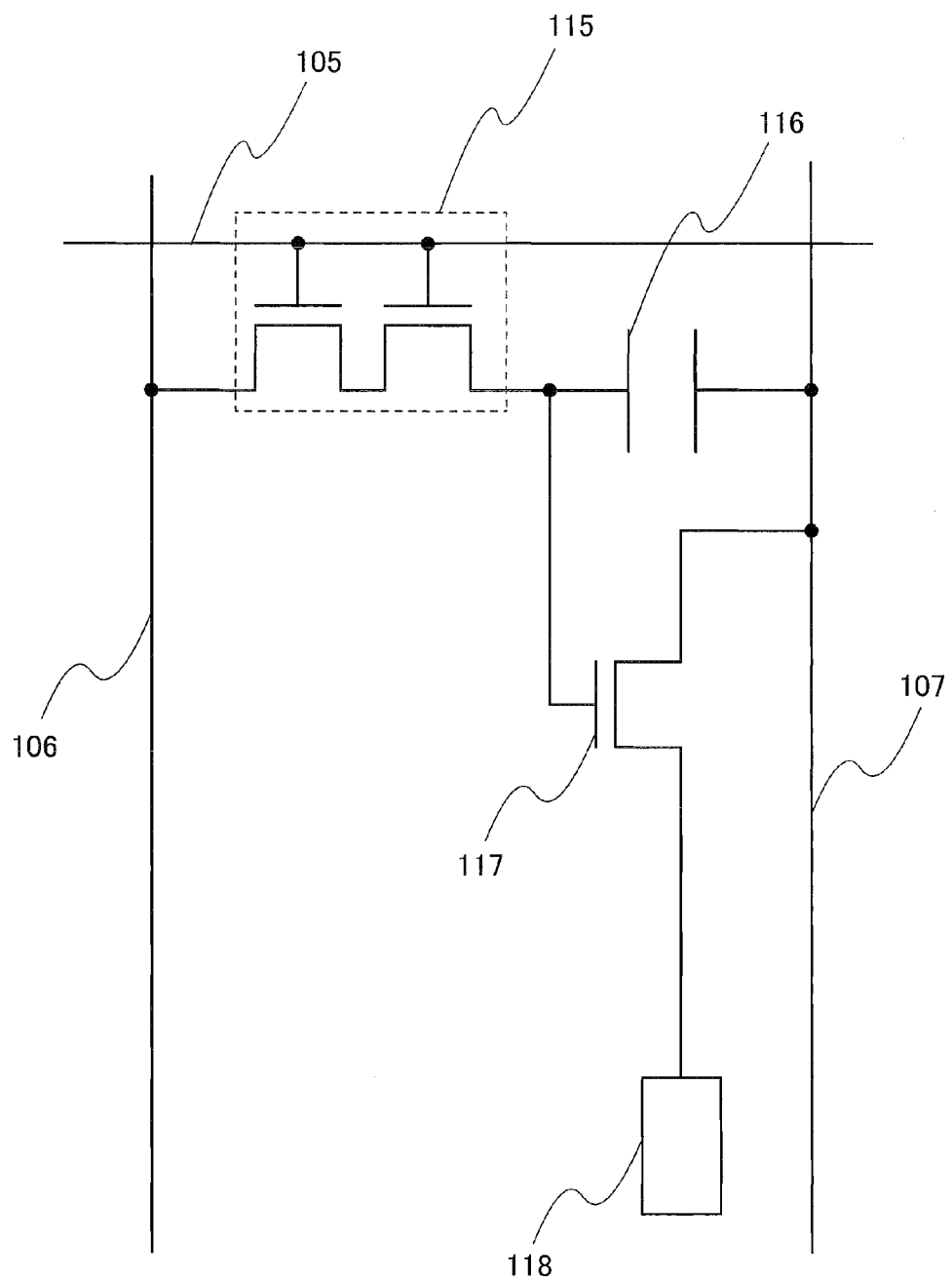
FIG. 4 is a circuit diagram illustrating a pixel structure of a display device of the present invention in Embodiment Mode 1.

The circuit configuration of the pixel illustrated in FIG. 3 is illustrated in FIG. 4. The pixel illustrated in FIG. 4 includes the switching transistor 115 which has at least a gate terminal, a source terminal, and a drain terminal; the capacitor 116 whose first terminal is electrically connected to the other of the source terminal and the drain terminal of the switching transistor 115; the driving transistor 117 which has at least a gate terminal, a source terminal, and a drain terminal and whose gate terminal is electrically connected to the other of the source terminal and the drain terminal of the switching transistor 115; and the light-emitting element 118 which is electrically connected to one of the source terminal and the drain terminal of the driving transistor 117. Further, the scan line 105 is electrically connected to the gate terminal of the switching transistor 115, the signal line 106 is electrically connected to one of the source terminal and the drain terminal of the switching transistor 115, and the power supply line 107 is electrically connected to a second terminal of the capacitor 116 and the other of the source terminal and the drain terminal of the driving transistor 117.

The switching transistor 115 functions as a switching element and is turned on or off in accordance with whether a potential difference between a potential of the gate terminal determined by a signal input from the scan line 105 and a potential of the source terminal, that is, a voltage between the gate terminal and the source terminal (hereinafter referred to as $V_{gs}$) is higher or lower than a threshold voltage (hereinafter referred to as $V_{th}$) of the transistor. When the switching transistor 115 is turned on, a signal from the signal line 106 is output to the capacitor 116 and the gate terminal of the driving transistor 117 through the switching transistor 115. Note that in FIGS. 3 and 4, a multi-gate transistor having a plurality of gate terminals is used as the switching transistor 115. By using a multi-gate transistor, an off current of the switching transistor 115 can be reduced. Further, the present invention is not limited to a multi-gate transistor and can be applied to any other structure such as a structure in which a plurality of transistors are provided.

The capacitor 116 functions as an auxiliary capacitor in a pixel and temporally stores the value equivalent to a potential of a signal input to the gate terminal of the driving transistor 117 as electric charges. When the switching transistor 115 is turned on and a signal is input from the signal line 106 through the switching transistor 115, electrical charges are stored in the capacitor 116 and a predetermined voltage is applied to the capacitor 116 in accordance with the stored electrical charges. Note that the capacitor 116 may be omitted by being substituted with gate capacitance of the driving transistor 117.

The driving transistor 117 has a function of controlling the light-emitting element 118 and is turned on or off in accordance with whether $V_{gs}$ is higher or lower than $V_{th}$. Further, the driving transistor 117 has a channel region in which the channel length direction is parallel to the longitudinal direction of the pixel as illustrated in FIG. 3.

The light-emitting element 118 may include a first electrode, a second electrode, and an electroluminescent layer interposed between the first electrode and the second electrode. Note that in this document, part or entire of the first electrode is referred to as a first terminal and part or entire of the second electrode is referred to as a second terminal. The first terminal of the light-emitting element 118 is electrically connected to one of the source terminal and the drain terminal of the driving transistor 117 and the second terminal thereof is grounded or held at a different potential. Further, the light-emitting element 118 has a function of emitting light with a current which flows from the power supply line 107 through the driving transistor 117 when the driving transistor 117 is turned on. The amount of light emission in the light-emitting element 118 can be changed depending on the amount of electrical charges of the flowing current.

Next, operation of the display device of this embodiment mode will be described. Note that the case where the display device described in this embodiment mode is operated by current drive will be described.

A signal is input to the switching transistor 115 through the scan line 105 which is selected so that the switching transistor 115 is turned on, whereby a potential of the signal line 106 is applied to a first terminal of the capacitor 116 through the switching transistor 115 which has been on. Then, electric charges for a voltage corresponding to a video signal are stored in the capacitor 116, and the capacitor 116 stores the voltage. This voltage corresponds to a potential on which $V_{gs}$ of the driving transistor 117 depends.

Then, electric charges stored in the capacitor 116 are transferred to the gate terminal of the driving transistor 117 so that the value of the potential of the gate terminal of the driving transistor 117 is equal to or substantially equal to that of the voltage stored in the capacitor 116. In accordance with the value of the potential, a current flows from the power supply line 107 to the light-emitting element 118 through the driving transistor 117. Thus, the light-emitting element 118 emits light.

The emission luminance of the light-emitting element 118 is substantially proportional to the amount of current flowing through the light-emitting element 118. Therefore, the gray scale of the pixel can be expressed by changing the amount of current flowing through the light-emitting element 118.

In the display device described in this embodiment mode, the current flowing through the light-emitting element 118 is applied from the power supply line 107 in accordance with the potential of the gate terminal of the driving transistor 117. Here, in general, a voltage between the drain terminal and the source terminal (hereinafter referred to as $V_{ds}$) of a transistor and a current flowing between the source terminal and the drain terminal (hereinafter referred to as $I_{ds}$) have a following relation.

Figure 5:
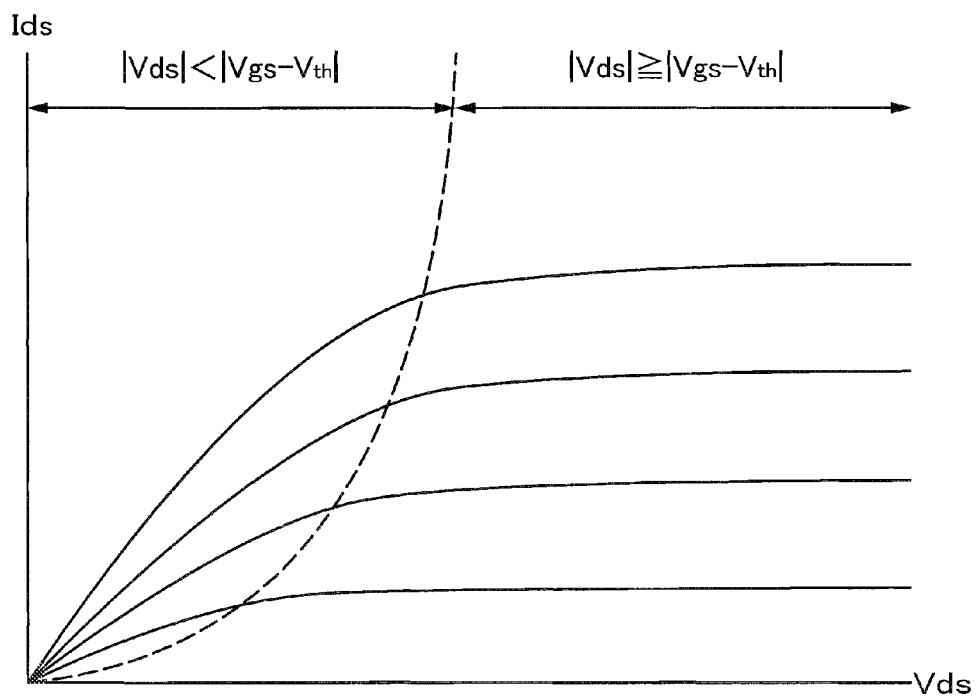
FIG. 5 is a graph illustrating a relation between a drain voltage and a drain current in a display device of the present invention.

The relation between $V_{ds}$ and $I_{ds}$ is described with reference to FIG. 5. FIG. 5 shows graphs of the relation between $V_{ds}$ and $I_{ds}$ of the transistor in this embodiment mode.

FIG. 5 shows a plurality of graphs corresponding to different gate voltages $V_{gs}$. The drain current $I_{ds}$ is increased as $|V_{gs}-V_{th}|$, an absolute value of a difference between $V_{gs}$ and $V_{th}$ of the transistor, is increased; in other words, $|V_{gs}|$, an absolute value of $V_{gs}$, is increased.

In the case where $|V_{gs}-V_{th}|$, an absolute value of a difference between $V_{gs}$ and $V_{th}$, is higher than $|V_{ds}|$, an absolute value of $V_{ds}$, the transistor operates in the linear region. In the case where $|V_{gs}-V_{th}|$ is lower than or equal to $|V_{ds}|$, an absolute value of $V_{ds}$, the transistor operates in the saturation region. When the transistor operates in the saturation region, $I_{ds}$ is hardly changed even if $V_{ds}$ is changed, and the current value is determined only by the value of $V_{gs}$.

In the display device described in this embodiment mode, when the light-emitting element 118 emits light, the driving transistor 117 is operated in the saturation region in which $|V_{ds}|$, an absolute value of $V_{ds}$, is higher than or equal to $|V_{gs}-V_{th}|$, an absolute value of a difference between $V_{gs}$ and $V_{th}$ of the driving transistor, that is, $|V_{ds}|=|V_{gs}-V_{th}|$ (hereinafter referred to as Formula 1) is satisfied. Note that when the light-emitting element 118 is made to emit no light, the driving transistor 117 is turned off.

The gray scale of the pixel in the display device is expressed by changing a potential of the gate terminal of the driving transistor to change the amount of current flowing through the light-emitting element (by an analog current gray scale method). That is, in an analog current gray scale method, gray scale display is performed by changing an analog video signal input to the signal line (by changing the potential of the signal line).

In general, in the case where a driving transistor is operated in the saturation region when a light-emitting element emits light, there is a problem in that variations in mobility or thresholds of thin film transistors among pixels lead to variation in $I_{ds}$, resulting in display unevenness of the display device. In particular, in the case of a transistor having a semiconductor layer formed using a polycrystalline semiconductor material, there is wide variations in mobility or thresholds of transistors between pixels, which makes it difficult to operate a display device by current drive. This is because, in crystallization (laser crystallization or the like) of a semiconductor layer, it is difficult to obtain a polycrystalline semiconductor layer having crystal grain boundaries uniformly in the entire region of a pixel portion.

On the other hand, in the display device described in this embodiment mode, single crystal semiconductor materials are used for semiconductor layers of transistors; thus, variations in mobility or thresholds of the transistors included in pixels and a peripheral circuit can be reduced. Accordingly, even in the case where the driving transistor 117 is operated in the saturation region, a change in characteristics of the transistor is small; thus, display unevenness of the display device can be prevented even when the display device is operated by an analog current gray scale method.

Further, in the case where the driving transistor 117 is operated in the saturation region, $I_{ds}$ can be obtained by Formulae 2 and 3.

$$Ids = \frac{1}{2}\beta(Vgs - Vth)^2 \qquad \text{(Formula\_2)}$$

$$\beta = \mu Cox\left(\frac{W}{L}\right) \qquad \text{(Formula\_3)}$$

L, W, $\mu$, and $C_{ox}$ denote the channel length of a transistor, the channel width, mobility of the transistor, and capacitance in a gate insulating layer, respectively. These values are given values depending on materials. In this embodiment mode, since a single crystal semiconductor material is used for a semiconductor layer, mobility of the single crystal semiconductor material is μ. Further, the channel width W is preferably approximately 3 to 6 μm.

Next, the channel length L of a driving transistor suitable for the display device of this embodiment mode is calculated based on Formula 1. When it is assumed that the size of the panel of the display device of this embodiment mode is approximately 1 to 5 inches, the amount of current flowing through a display element in one pixel for display is desirably approximately 0.1 to 1.0 μA. Further, considering characteristics of the light-emitting element of the display device of this embodiment mode, the amount of current flowing through the light-emitting element in one pixel for display is more desirably approximately 0.2 μA. In the case where the optimal channel length L for accurate operation in the driving transistor is calculated assuming that the amount of current flowing through the display element in one pixel for display is 0.2 μA based on the above, L≥143 μm (hereinafter referred to as Formula 4) is desirably satisfied. By setting the channel length L within the range of Formula 4, a short channel effect in the driving transistor can be suppressed and further, the value of an on current can be controlled so as to be the value in the range suitable for the display device of the present invention.

Further, the aperture ratio of a pixel is desirably at least 20%. From the above, when the minimum aperture ratio is 20%, L≤AX (0<A≤0.7) (hereinafter referred to as Formula 5) is desirably satisfied between the channel length L of the driving transistor and the longitudinal length X of the pixel. In the case where L is larger than X, a semiconductor layer is required to be formed by, for example, being folded in the pixel; therefore, the length of the semiconductor layer is further increased, which leads to increase in dimension thereof. However, by designing the driving transistor so that L is within the range of Formula 5, the driving transistor can be provided to have the minimum size within the range of the pixel size. Further, by designing the driving transistor so that L is within the above range, at least the minimum aperture ratio can be obtained. Further, overlapping with a wiring or the like can be prevented.

Further, it can be said that when Formulas 3 and 4 are combined, 143≤L≤AX (0<A≤0.7, X≥204) (hereinafter referred to as Formula 6) is desirably satisfied between L and X.

The channel length L of the driving transistor and the longitudinal length X of the pixel are within the range of Formula 6, so that a short channel effect in the driving transistor can be suppressed, the value of an on current can be controlled so as to be the value in the range suitable for the display device of the present invention, and the dimension of the driving transistor can be minimized.

Thus, as for the display device of this embodiment mode, by applying single crystal semiconductor materials to semiconductor layers of circuit elements such as transistors of the display portion and the peripheral circuit portion and forming the display portion and the peripheral circuit portion over one substrate, lower power consumption, reduction in size, and higher-speed drive can be achieved in the display portion. Further, the display device in this embodiment mode can be operated in the saturation region; therefore, variations in luminance among pixels can be suppressed and display such as gray scale display can be performed more accurately.

The display device in this embodiment mode can be operated at a desired driving voltage without being provided with another circuit such as a booster circuit in an interface portion between the display portion and the peripheral circuit portion. Therefore, the circuit dimension can be reduced by the dimension of the circuit which can be omitted.

Embodiment Mode 2

In this embodiment mode, an example of a method for manufacturing transistors included in the display portion and the peripheral circuit portion of the display device of the present invention will be described.

First, the method for manufacturing transistors included in the display portion and the peripheral circuit portion of the display device of the present invention in this embodiment mode will be described with reference to FIGS. 6A and 6B, FIGS. 7A and 7B, FIGS. 8A and 8B, FIGS. 9A and 9B, FIGS. 10A and 10B, FIGS. 11A and 11B, and FIG. 12. FIGS. 6A and 6B, FIGS. 7A and 7B, FIGS. 8A and 8B, FIGS. 9A and 9B, FIGS. 10A and 10B, FIGS. 11A and 11B, and FIG. 12 are cross-sectional views illustrating the method for manufacturing transistors included in the display portion and the peripheral circuit portion of the display device of the present invention. Note that in this embodiment mode, dimensions different from actual dimensions are used for part or all of components for convenience.

Figure 6A:
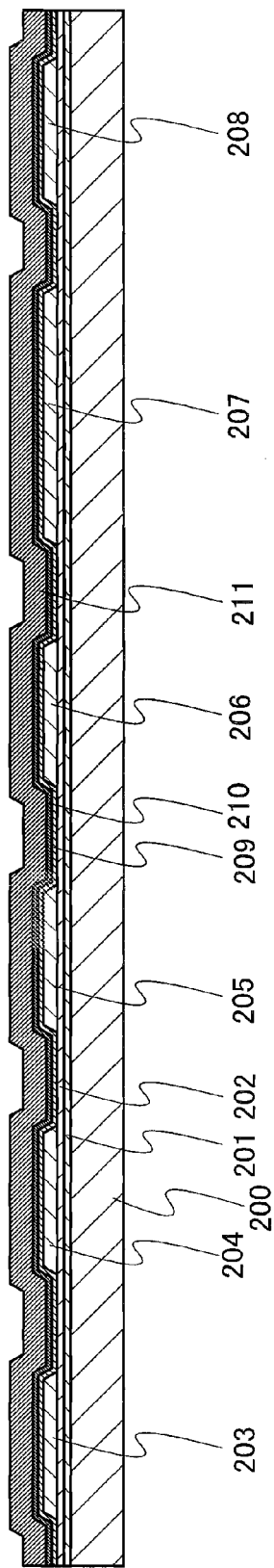
FIGS. 6A and 6B are cross-sectional views illustrating a method for manufacturing a transistor included in a display device of the present invention in Embodiment Mode 2.

First, as illustrated in FIG. 6A, a semiconductor layer is formed over a substrate 200 with a first insulating layer 201 and a second insulating layer 202 interposed therebetween. Further, a first semiconductor layer 203, a second semiconductor layer 204, a third semiconductor layer 205, a fourth semiconductor layer 206, a fifth semiconductor layer 207, and a sixth semiconductor layer 208, which have island shapes, are formed from the semiconductor layer.

As the substrate 200, a glass substrate, a quartz substrate, a ceramic substrate, a plastic substrate, a sapphire substrate, a metal substrate having a surface subjected to insulation treatment, or the like can be used. Each of the semiconductor layers can be formed using a single crystal semiconductor material such as silicon, germanium, or a compound semiconductor such as gallium arsenide or indium phosphide.

Further, after the first semiconductor layer 203, the second semiconductor layer 204, the third semiconductor layer 205, the fourth semiconductor layer 206, the fifth semiconductor layer 207, and the sixth semiconductor layer 208 are formed, a p-type impurity element may be added. As the p-type impurity element, an element belonging to Group 13 of the periodic table, such as boron, aluminum, or gallium, can be used. By adding the p-type impurity element, $V_{th}$ of a transistor to be formed later can be controlled.

Further, the substrate 200 and the semiconductor layer are bonded together with the first insulating layer 201 and the second insulating layer 202 interposed therebetween. An example of a method for bonding the substrate 200 and the semiconductor layer together will be described with reference to FIGS. 13A to 13C and FIGS. 14A to 14C. FIGS. 13A to 13C and FIGS. 14A to 14C are cross-sectional views illustrating a method for bonding the substrate and the semiconductor layer together in this embodiment mode. Note that in this embodiment mode, dimensions different from actual dimensions are used for part or all of components in FIGS. 13A to 13C and FIGS. 14A to 14C for convenience.

Figure 13A:
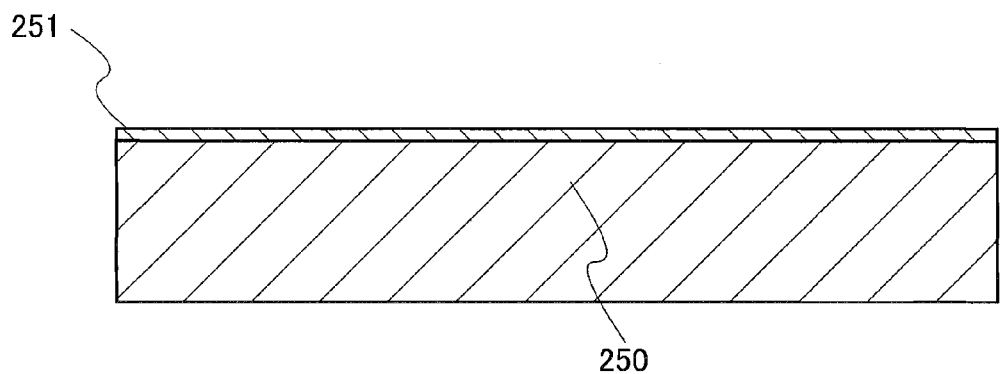
FIGS. 13A to 13C are cross-sectional views illustrating a method for bonding together a substrate and a semiconductor layer of a transistor included in a display device of the present invention in Embodiment Mode 2.

First, as illustrated in FIG. 13A, a first insulating layer 251 is formed on one of surfaces of a semiconductor substrate 250. For the semiconductor substrate 250, a single crystal semiconductor material such as silicon, germanium, or a compound semiconductor such as gallium arsenide or indium phosphide can be used. Further, the first insulating layer 251 is a layer the same as the second insulating layer 202 illustrated in FIGS. 6A and 6B and can be formed to have a layered structure including two or more layers formed using silicon nitride, silicon nitride oxide, or silicon oxynitride. The first insulating layer 251 can be formed by a chemical vapor deposition (CVD) method, a sputtering method, or the like. The first insulating layer 251 is preferably formed to a thickness of 50 to 200 nm. Note that in this document, a CVD method includes a plasma CVD method, a thermal CVD method, and a photo CVD method in its category.

Note that silicon oxynitride refers to a substance which contains more oxygen than nitrogen and contains oxygen, nitrogen, silicon, and hydrogen at given concentrations ranging from 55 to 65 atomic %, 0.5 to 20 atomic %, 25 to 35 atomic %, and 0.1 to 10 atomic %, respectively, where the total percentage of atoms is 100 atomic %. Further, silicon nitride oxide refers to a substance which contains more nitrogen than oxygen and contains oxygen, nitrogen, silicon, and hydrogen at given concentrations ranging from 5 to 30 atomic %, 20 to 50 atomic %, 25 to 35 atomic %, and 15 to 25 atomic %, respectively, where the total percentage of atoms is 100 atomic %.

Figure 13B:
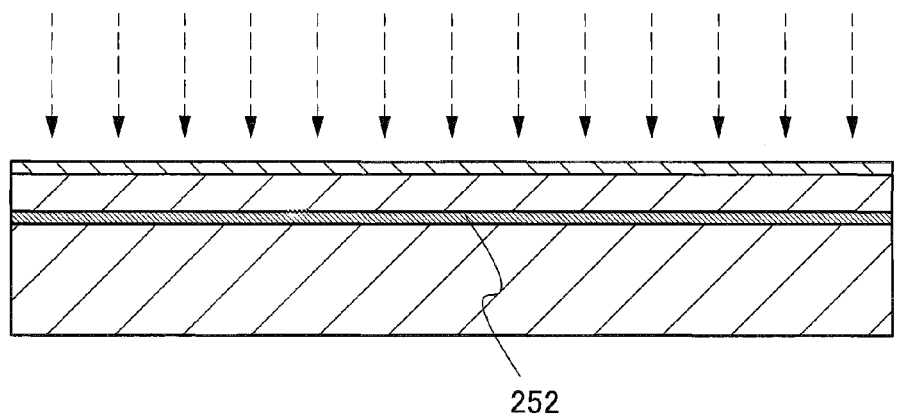

Then, as illustrated in FIG. 13B, an ion beam including hydrogen ions accelerated by an electric field is delivered to the semiconductor substrate 250 through the first insulating layer 251, thereby forming a region 252 doped with hydrogen in the semiconductor substrate 250 at a given depth from one of the surfaces thereof.

Figure 13C:
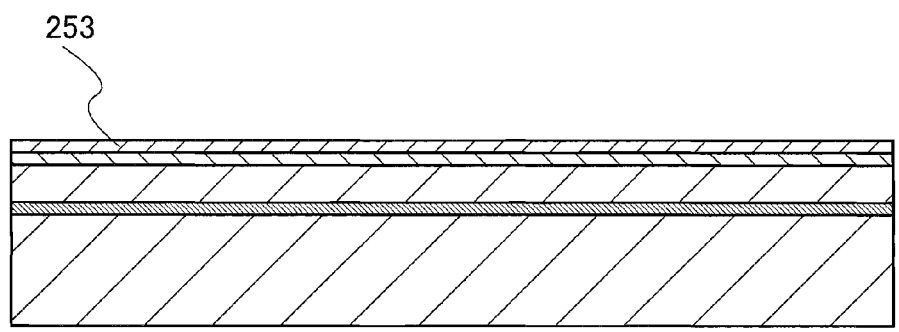

Then, as illustrated in FIG. 13C, a bonding layer 253 is formed over the first insulating layer 251. The bonding layer 253 is provided on a surface on which the semiconductor substrate 250 and a supporting substrate forms a bond. The bonding layer 253 may have a single-layer structure or a layered structure including two or more layers, and a surface which forms a bond with the semiconductor substrate 250 (hereinafter referred to as a bonding surface) is preferably smooth and hydrophilic.

Figure 6B:
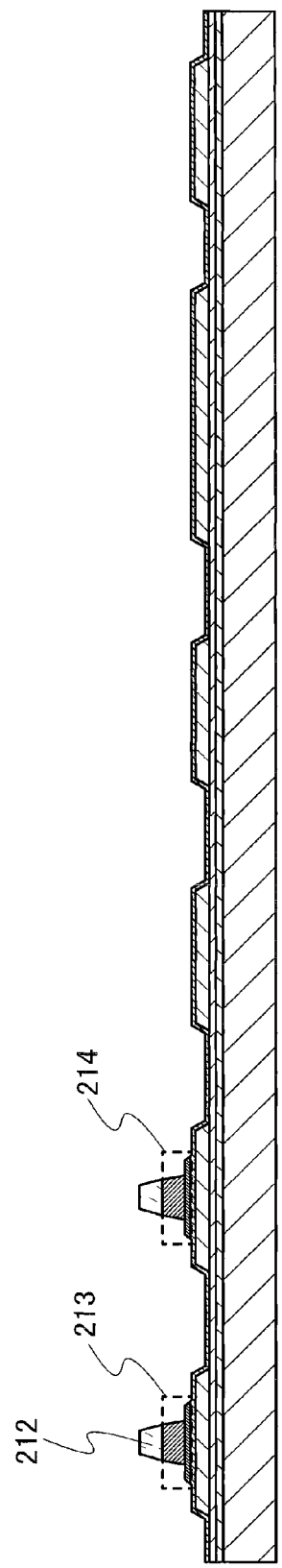

The bonding layer 253 is a layer the same as the insulating layer 201 in FIGS. 6A and 6B. The bonding layer 253 whose bonding surface is smooth and hydrophilic can be formed using silicon oxide containing hydrogen, silicon nitride containing hydrogen, silicon nitride containing oxygen and hydrogen, silicon oxynitride, silicon nitride oxide, or the like.

As silicon oxide containing hydrogen, for example, silicon oxide formed by a chemical vapor deposition method using organosilane is preferable. This is because a silicon oxide film formed of organosilane can increase bonding strength between the supporting substrate and the semiconductor substrate 250. As organosilane, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris(dimethylamino)silane (chemical formula: $SiH(N(CH_3)_2)_3$) can be used.

Note that in the case where the bonding layer 253 is formed using silicon oxide, the bonding layer 253 can be formed by a CVD method using monosilane, disilane, or trisilane as a source gas. Further, the silicon oxide layer serving as the bonding layer may be a thermal oxide film and preferably contains chlorine.

Silicon nitride containing hydrogen can be formed by a plasma CVD method using a silane gas and an ammonia gas. Further, hydrogen may be added to the gases. Silicon nitride containing oxygen and hydrogen can be formed by a plasma CVD method using a silane gas, an ammonia gas, and a nitrous oxide gas. In either case, for the bonding layer 253, silicon oxide, silicon oxynitride, or silicon nitride oxide, which is formed by a CVD method such as a plasma CVD method, a reduced pressure CVD method, or an atmosphere pressure CVD method using a silane gas or the like as a source gas, can be used as long as it contains hydrogen. In film formation by a CVD method, temperatures at which degasification from the region 252 doped with hydrogen, which is formed in the semiconductor substrate 250, does not occur are applied. For example, the deposition temperature is preferably lower than or equal to 350° C.

The thickness of the bonding layer 253 can be larger than or equal to 10 nm and smaller than or equal to 200 nm. The preferable thickness is larger than or equal to 10 nm and smaller than or equal to 100 nm, and the more preferable thickness is larger than or equal to 20 nm and smaller than or equal to 50 nm.

Figure 14A:
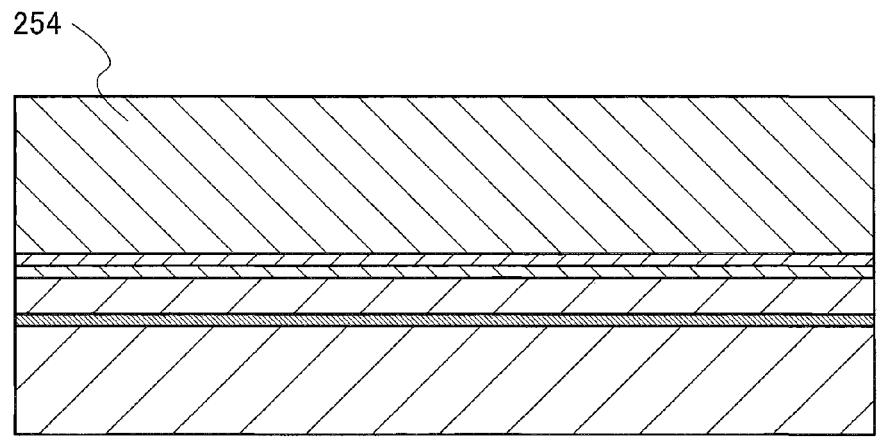
FIG. 14A to 14C are cross-sectional views illustrating the method for bonding together a substrate and a semiconductor layer of a transistor included in a display device of the present invention in Embodiment Mode 2.

Then, as illustrated in FIG. 14A, the semiconductor substrate 250 and a supporting substrate 254 prepared separately are placed in close contact with each other. By placing a surface of the bonding layer 253 formed over the semiconductor substrate 250 and a surface of the supporting substrate 254 in close contact with each other, the semiconductor substrate 250 and the supporting substrate 254 are bonded together. This bond is formed by a hydrogen bond or Van der Waals forces. When the hydrogen bond forms the bond, the surface of the substrate has a hydrophilic property, hydroxyl or water molecules serve as an adhesive agent, and the water molecules diffuse by thermal treatment, whereby residual components form a silanol group (Si—OH). Further, in this bonding portion, when hydrogen is released, a siloxane bond (O—Si—O) is formed to generate a covalent bond, so that the semiconductor substrate 250 and the supporting substrate 254 can be bonded together strongly.

The supporting substrate 254 is the same as the substrate 200 illustrated in FIGS. 6A and 6B and a substrate having an insulating surface can be used as the supporting substrate 254. As the substrate having an insulating surface, any of a variety of glass substrates which are used in the electronics industry, such as an aluminosilicate glass substrate, an aluminoborosilicate glass substrate, and a barium borosilicate glass substrate; a quartz substrate; a ceramic substrate; a sapphire substrate; or the like can be used.

Note that in order that the supporting substrate 254 and the bonding layer 253 may be favorably bonded, a bonding surface may be activated. For example, one or both of the surfaces which are to form a bond are irradiated with an atomic beam or an ion beam. When an atomic beam or an ion beam is used, an inert gas neutral atom beam or an inert gas ion beam of argon or the like can be used. Alternatively, plasma irradiation or radical treatment may be performed for activation of the surfaces which are to form a bond. Such surface treatment facilitates formation of a bond between different kinds of materials even at a temperature of lower than or equal to 400° C.

After the supporting substrate 254 and the semiconductor substrate 250 are bonded together with the bonding layer 253 interposed therebetween, one of or both thermal treatment and pressure treatment is preferably performed. Thermal treatment or pressure treatment makes it possible to increase bonding strength between the supporting substrate 254 and the semiconductor substrate 250. The thermal treatment is performed at a temperature lower than or equal to the upper temperature limit of the supporting substrate 250. The pressure treatment is performed so that pressure is applied perpendicularly to the bonding surface in consideration of the pressure resistance of the supporting substrate 254 and the semiconductor substrate 250.

Figure 14B:
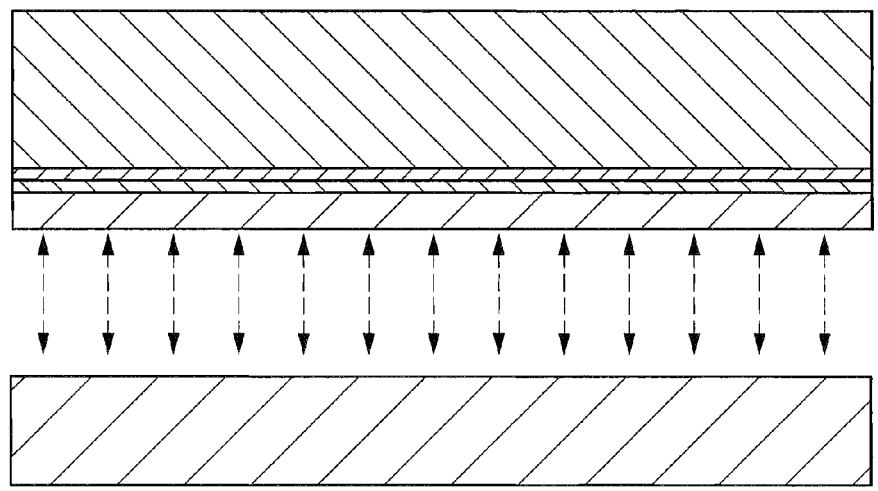
Figure 14C:
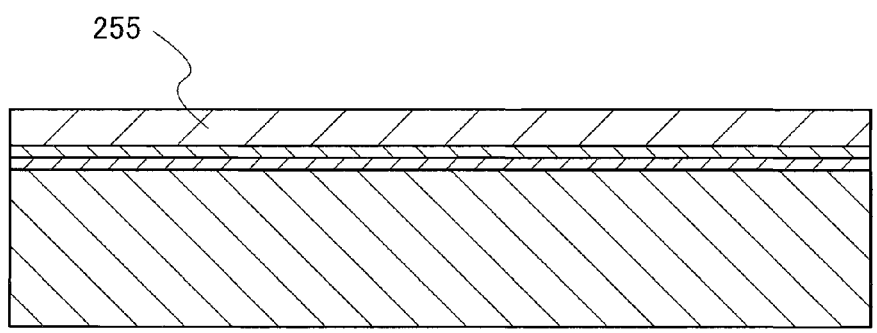

Then, as illustrated in FIG. 14B, by performing thermal treatment on the semiconductor substrate 250, the semiconductor substrate 250 is cleaved using the region 252 as a cleavage plane. The thermal treatment is preferably performed at a temperature higher than or equal to the temperature at which the bonding layer 253 is formed and lower than or equal to the upper temperature limit of the supporting substrate 254. For example, by performing thermal treatment at process temperatures in the range of 400 to 700° C., there occurs a change in volume of a microvoid formed in the region 252 and thus cleavage along the region 252 is possible. Since the bonding layer 253 is bonded to the supporting substrate 254, a semiconductor layer separated from the semiconductor substrate 250 is bonded to and left on the supporting substrate 254 as the semiconductor layer 255 having the same crystal structure and crystal orientation as the semiconductor substrate 250 as illustrated in FIG. 14C.

Thermal treatment in a temperature range of 400 to 700° C. may be continuously performed in the same apparatus as the above thermal treatment for increasing the bonding strength or in another apparatus. For example, after thermal treatment in a furnace at 200° C. for 2 hours, the temperature is increased to approximately 600° C. and kept for 2 hours. Then, the temperature is decreased to a temperature ranging from room temperature to 400° C., and the substrate is taken out of the furnace. Alternatively, thermal treatment may be performed at a temperature which has been increased from room temperature. Further alternatively, thermal treatment may be performed in a furnace at 200° C. for 2 hours, and then, thermal treatment may be performed in a temperature range of 600 to 700° C. for 1 to 30 minutes (e.g., at 600° C. for 7 minutes or at 650° C. for 7 minutes) in a rapid thermal annealing (RTA) apparatus.

By thermal treatment in a temperature range of 400 to 700° C., bonding between the bonding layer 253 and the supporting substrate 254 shifts from hydrogen bonds to covalent bonds, and an element added to the region 252 is separated out and the pressure rises, so that the semiconductor substrate 250 can be cleaved to form the semiconductor layer 255. After the thermal treatment, the supporting substrate 254 and the semiconductor substrate 250 are in a state where one of the supporting substrate 254 and the semiconductor substrate 250 is provided over the other, and the supporting substrate 254 and the semiconductor substrate 250 can be separated from each other without application of large force. For example, one substrate provided over the other substrate is lifted by a vacuum chuck, so that the substrate can be easily separated. At this time, by fixing the lower substrate with a vacuum chuck or a mechanical chuck, the supporting substrate 254 and the semiconductor substrate 250 can be separated from each other without horizontal deviation.

Note that at that time, in order to improve crystallinity of the semiconductor layer 255, a surface of the semiconductor layer 255 formed over the supporting substrate 254 may be irradiated with a laser beam. By laser beam irradiation, defects in the semiconductor layer 255 can be repaired.

Further, in order to improve planarity of the surface of the semiconductor layer 255 formed over the supporting substrate 254, dry etching or wet etching may be performed. By performing dry etching or wet etching, part of the semiconductor layer 255 can be removed to suppress roughness of the surface thereof.

Alternatively, in order to improve crystallinity of a surface of the semiconductor layer 255 formed over the supporting substrate 254, thermal treatment may be performed. For example, the thermal treatment is preferably performed at higher than or equal to 500° C. and lower than or equal to 700° C. By the thermal treatment, a defect and deformation of the semiconductor layer 255, which are not repaired by laser beam irradiation, can be eliminated and alleviated, respectively.

The semiconductor layer formed using a single crystal semiconductor material, which is provided over a substrate with an insulating layer interposed therebetween, can be formed by the method described above. Note that the method illustrated in FIGS. 13A to 13C and FIGS. 14A to 14C is only an example, so the semiconductor layer can be formed using any other method.

After the semiconductor layer is formed over the substrate as described above, a first gate insulating layer 209 is formed over the first semiconductor layer 203, the second semiconductor layer 204, the third semiconductor layer 205, the fourth semiconductor layer 206, the fifth semiconductor layer 207, and the sixth semiconductor layer 208, each of which is formed into an island shape; a first conductive layer 210 is formed over the first gate insulating layer 209; and a second conductive layer 211 is formed over the first conductive layer 210, as illustrated in FIG. 6A.

The first gate insulating layer 209 can be formed of a single layer of silicon oxide, silicon nitride, silicon oxynitride, or silicon nitride oxide or a stack of any of the above. The first gate insulating layer 209 can be formed using a plasma CVD method, a sputtering method, or the like. Alternatively, high density plasma treatment or the like may be used. Further, the first gate insulating layer 209 is preferably formed to a thickness of 10 to 40 nm.

Each of the first conductive layer 210 and the second conductive layer 211 can be formed using an element selected from tantalum, tungsten, titanium, molybdenum, aluminum, copper, chromium, niobium, or the like; or an alloy or compound material containing any of the above elements as its main component. In this embodiment mode, tantalum nitride and tungsten are used for the first conductive layer 210 and the second conductive layer 211, respectively.

Then, as illustrated in FIG. 6B, first resist masks 212 are formed and first etching treatment and second etching treatment are performed. The first etching treatment is isotropic etching treatment and can be performed using inductively coupled plasma (ICP) or the like. Meanwhile, the second etching treatment is anisotropic etching treatment and can be performed by using ICP or the like and applying a self-bias voltage lower than that in the first etching treatment.

By performing the first etching treatment and the second etching treatment, part of the first conductive layer 210 and the second conductive layer 211, over which the first resist masks 212 are not provided, is removed to form an electrode including the first conductive layer 210 over a part of the semiconductor layer, on which a transistor of a peripheral circuit portion in the display device of the present invention is formed, and the second conductive layer 211 provided over the first conductive layer 210. In this embodiment mode, an electrode 213 and an electrode 214 are formed over the first semiconductor layer 203 and the second semiconductor layer 204, respectively, with the first gate insulating layer 209 interposed therebetween.

Note that in this embodiment mode, tapered portions can be provided at end portions of the electrode 213 and the electrode 214 which are left after the first etching treatment and the second etching treatment. The angle of each of the tapered portions is preferably 45 to 85°. Provision of the tapered portions facilitates formation of a layer to be provided over the end portions.

Figure 7A:
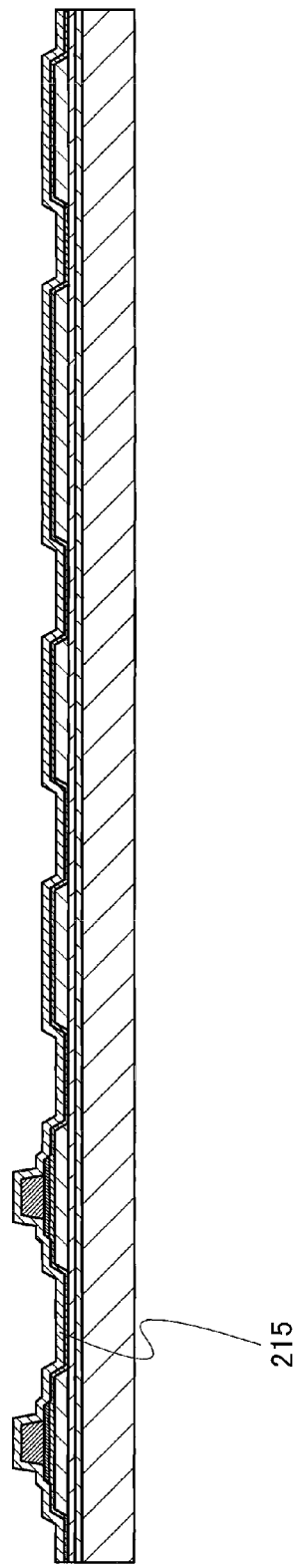
FIGS. 7A and 7B are cross-sectional views illustrating the method for manufacturing a transistor included in a display device of the present invention in Embodiment Mode 2.

Then, as illustrated in FIG. 7A, the first resist masks 212 are removed, and a second gate insulating layer 215 is formed over the first semiconductor layer 203, the second semiconductor layer 204, the third semiconductor layer 205, the fourth semiconductor layer 206, the fifth semiconductor layer 207, and the sixth semiconductor layer 208 with the electrode 213, the electrode 214, and the first gate insulating layer 209 interposed therebetween.

The second gate insulating layer 215 can be formed applying a single layer or a stack of a material applicable to the first gate insulating layer 209. The second gate insulating layer 215 is preferably formed to a thickness of 40 to 100 nm, and the total thickness of the second gate insulating layer 215 and the first gate insulating layer 209 provided over the semiconductor layer to serve as the semiconductor layer of a transistor in a display portion may be 80 to 110 nm. Further, there may be the case where the first gate insulating layer 209 is partially etched to have a thickness smaller than the desired thickness through the first etching treatment and the second etching treatment; therefore, the thickness of the second gate insulating layer 215 may be set in consideration of the thickness of the first gate insulating layer 209, which has been reduced by etching.

At this time, a p-type impurity element or an n-type impurity element is added to the semiconductor layer to serve as an auxiliary capacitor of a pixel of the display device of the present invention through the first gate insulating layer 209 and the second gate insulating layer 215. In this embodiment mode, boron is added to the sixth semiconductor layer 208.

Figure 7B:
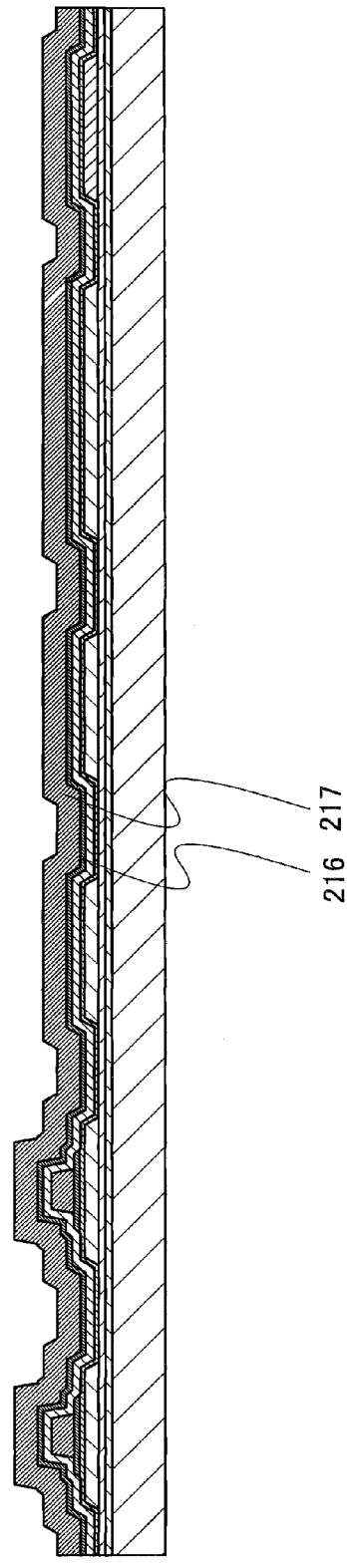

Then, as illustrated in FIG. 7B, a third conductive layer 216 is formed over the second gate insulating layer 215, and a fourth conductive layer 217 is formed over the third conductive layer 216. The third conductive layer 216 can be formed using a material applicable to the first conductive layer 210, and the fourth conductive layer 217 can be formed using a material applicable to the second conductive layer 211. In this embodiment mode, tantalum nitride and tungsten are used for the third conductive layer 216 and the fourth conductive layer 217, respectively.

Figure 8A:
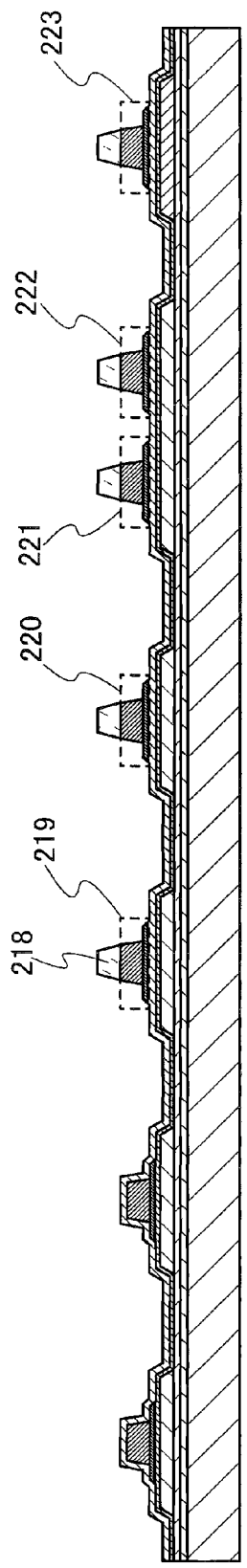
FIGS. 8A and 8B are cross-sectional views illustrating the method for manufacturing a transistor included in a display device of the present invention in Embodiment Mode 2.

Then, as illustrated in FIG. 8A, second resist masks 218 are formed and third etching treatment and fourth etching treatment are performed. The third etching treatment is isotropic etching treatment and can be performed using inductively coupled plasma (ICP) or the like. Meanwhile, the fourth etching treatment is anisotropic etching treatment and can be performed by using ICP or the like and applying a self-bias voltage lower than that in the third etching treatment.

By performing the third etching treatment and the fourth etching treatment, part of the third conductive layer 216 and the fourth conductive layer 217, over which the second resist masks 218 are not provided, is removed to form an electrode including the third conductive layer 216 over a part of the semiconductor layer, on which a transistor of the display portion in the display device is formed, and the fourth conductive layer 217 provided over the third conductive layer 216. In this embodiment mode, an electrode 219, an electrode 220, electrodes 221 and 222, and an electrode 223 are formed over the third semiconductor layer 205, the fourth semiconductor layer 206, the fifth semiconductor layer 207, and the sixth semiconductor layer 208, respectively, with the first gate insulating layer 209 and the second gate insulating layer 215 interposed therebetween.

Note that in this embodiment mode, tapered portions can be provided at end portions of the electrodes 219, 220, 221, 222, and 223 which are left after the third etching treatment and the fourth etching treatment. The angle of each of the tapered portions is preferably 45 to 85°. Provision of the tapered portions facilitates formation of a layer to be provided over the end portions.

Figure 8B:
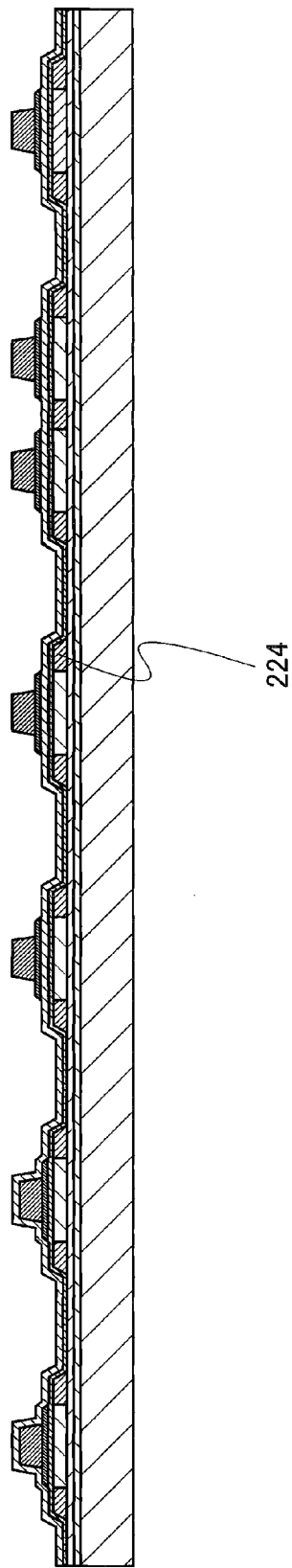

Then, doping treatment is performed on the first semiconductor layer 203, the second semiconductor layer 204, the third semiconductor layer 205, the fourth semiconductor layer 206, the fifth semiconductor layer 207, and the sixth semiconductor layer 208. As for the doping treatment, first, an n-type impurity element is added as illustrated in FIG. 8B. As the n-type impurity element, an element belonging to Group 15 of the periodic table, such as phosphorus, can be used. In this embodiment mode, phosphorus is added to form a first n-type impurity region 224 in part of each of the semiconductor layers.

Then, of the plurality of semiconductor layers, the semiconductor layer to be included in a p-channel transistor is doped with a p-type impurity element and the semiconductor layer to be included in an n-channel transistor is doped with an n-type impurity element, so that a first impurity region formed of a p-type impurity region or an n-type impurity region and a second impurity region in which impurity concentration is lower than that in the first impurity region are formed in each of the semiconductor layers. In the case where the auxiliary capacitor is also formed at that time, the semiconductor layer to serve as the auxiliary capacitor is also doped with a p-type impurity element.

In this embodiment mode, first, as illustrated in FIG. 9A, a third resist mask 225 is formed over each of the second semiconductor layer 204, the fourth semiconductor layer 206, and the fifth semiconductor layer 207, and boron is added as a p-type impurity element to form first p-type impurity regions 226 in regions of the first semiconductor layer 203 and the third semiconductor layer 205, over which the electrodes are not formed. In addition, in the first semiconductor layer 203, second p-type impurity regions 227 in which impurity concentration is lower than that in the first p-type impurity regions 226 are formed in regions over which the second conductive layer included in the electrode is not formed and the first conductive layer included in the electrode is formed. In the third semiconductor layer 205, the second p-type impurity regions 227 in which impurity concentration is lower than that in the first p-type impurity regions 226 are formed in regions over which the fourth conductive layer included in the electrode is not formed and the third conductive layer included in the electrode is formed. Further, in the sixth semiconductor layer 208, the first p-type impurity regions 226 are formed in regions over which the electrode is not formed.

Then, as illustrated in FIG. 9B, a third resist mask 225 is removed, a fourth resist mask 228 is formed over each of the first semiconductor layer 203, the third semiconductor layer 205, part of the fifth semiconductor layer 207, and the sixth semiconductor layer 208, and phosphorus is added as an n-type impurity element to form second n-type impurity regions 229 in regions of the second semiconductor layer 204 and the fourth semiconductor layer 206, over which the electrodes are not formed. In addition, in the second semiconductor layer 204, third n-type impurity regions 230 in which impurity concentration is lower than that in the second n-type impurity regions 229 are formed in regions over which the second conductive layer included in the electrode is not formed and the first conductive layer included in the electrode is formed. In the fourth semiconductor layer 206, the third n-type impurity regions 230 in which impurity concentration is lower than that in the second n-type impurity regions 229 are formed in regions over which the fourth conductive layer included in the electrode is not formed and the third conductive layer included in the electrode is formed. Further, in the fifth semiconductor layer 207, the second n-type impurity regions 229 and the third n-type impurity regions 230 in which impurity concentration is lower than that in the second n-type impurity regions 229 are formed in regions over which the electrode is not formed.

By thus performing doping treatment after the first gate insulating layer 209 and the second gate insulating layer 215 are provided, doping treatment can be uniformly performed on parts other than the parts over which the electrodes are formed.

Figure 10A:
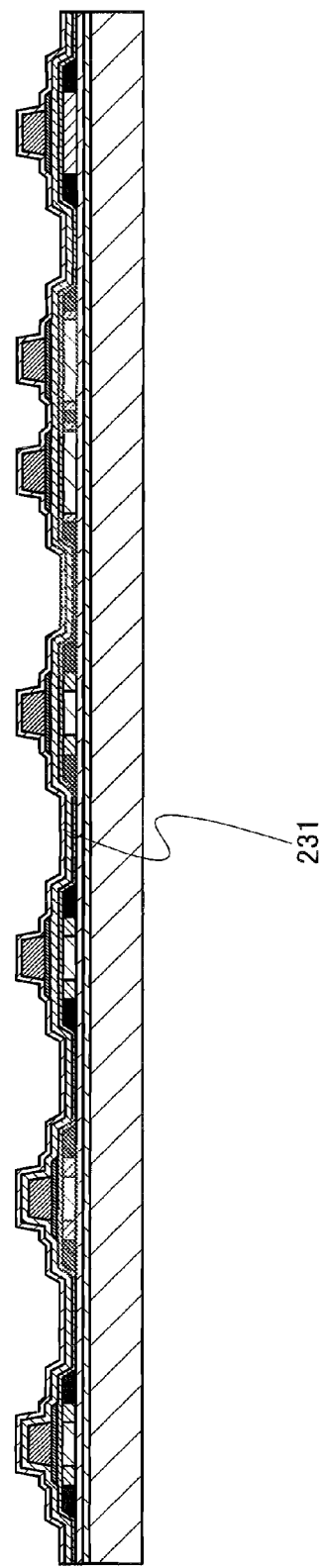
FIGS. 10A and 10B are cross-sectional views illustrating the method for manufacturing a transistor included in a display device of the present invention in Embodiment Mode 2.

Then, as illustrated in FIG. 10A, the fourth resist mask 228 is removed and a third insulating layer 231 is formed over the electrode 213, the electrode 214, the electrodes 219 to 223, and the second gate insulating layer 215. The third insulating layer 231 can be formed using silicon oxynitride or the like. In this embodiment mode, silicon oxynitride is used.

Note that thermal treatment may be performed after silicon oxynitride is formed. By performing thermal treatment, the formed layer can be activated.

Figure 10B:
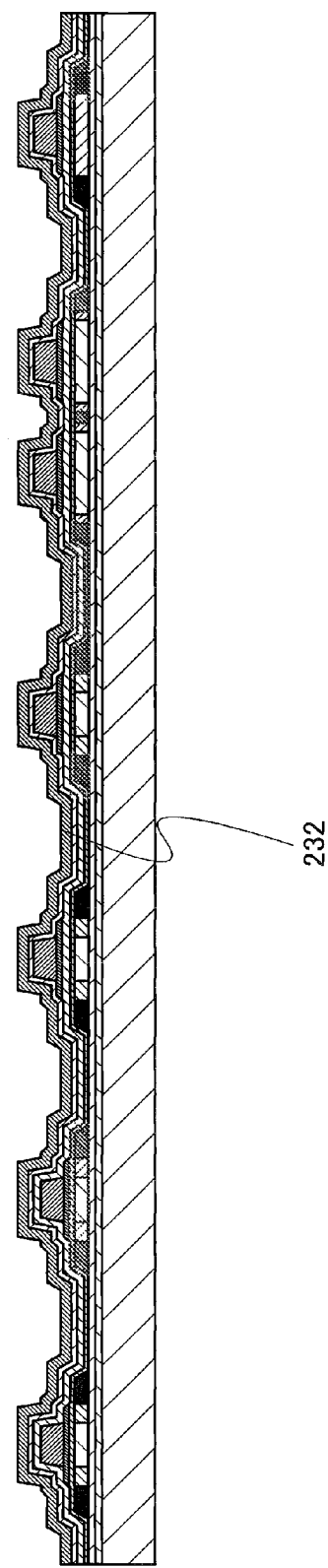

Then, as illustrated in FIG. 10B, a fourth insulating layer 232 is formed over the third insulating layer 231. The fourth insulating layer 232 can be formed using silicon nitride oxide or the like. In this embodiment mode, silicon nitride oxide is used. Note that in this case, thermal treatment is performed to hydrogenate the semiconductor layers.

Figure 11A:
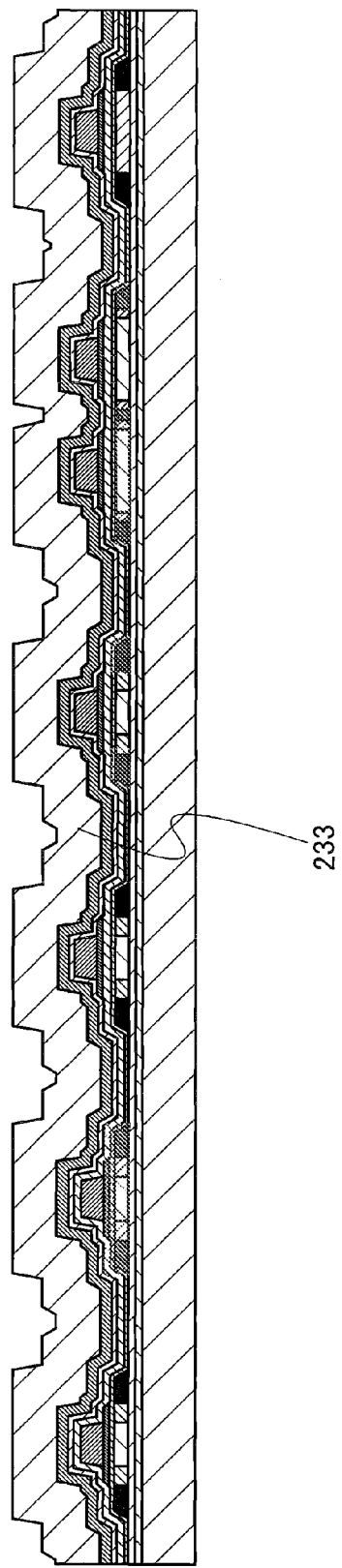
FIGS. 11A and 11B are cross-sectional views illustrating the method for manufacturing a transistor included in a display device of the present invention in Embodiment Mode 2.

Then, as illustrated in FIG. 11A, a fifth insulating layer 233 is formed so as to cover the fourth insulating layer 232. The fifth insulating layer 233 can be formed using silicon oxynitride or the like. In this embodiment mode, silicon oxynitride is used.

Figure 11B:
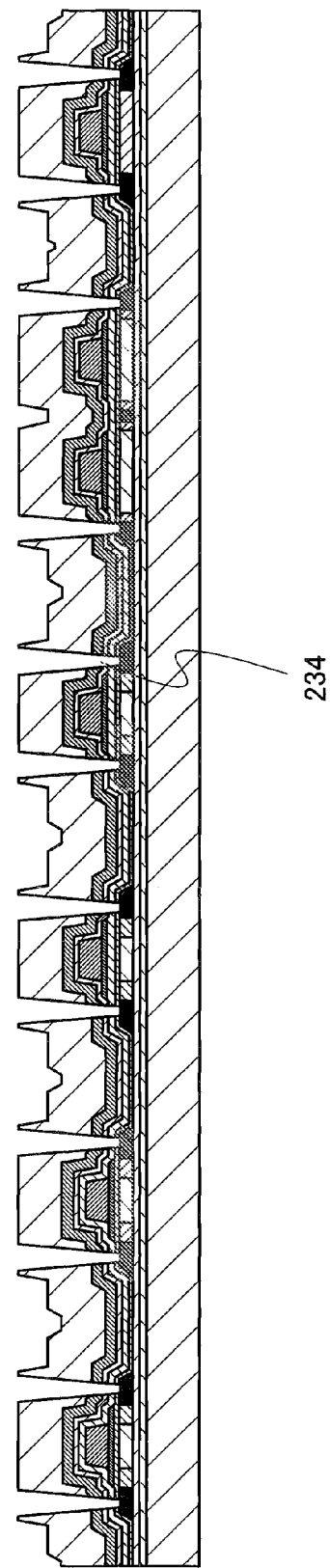
Figure 12:
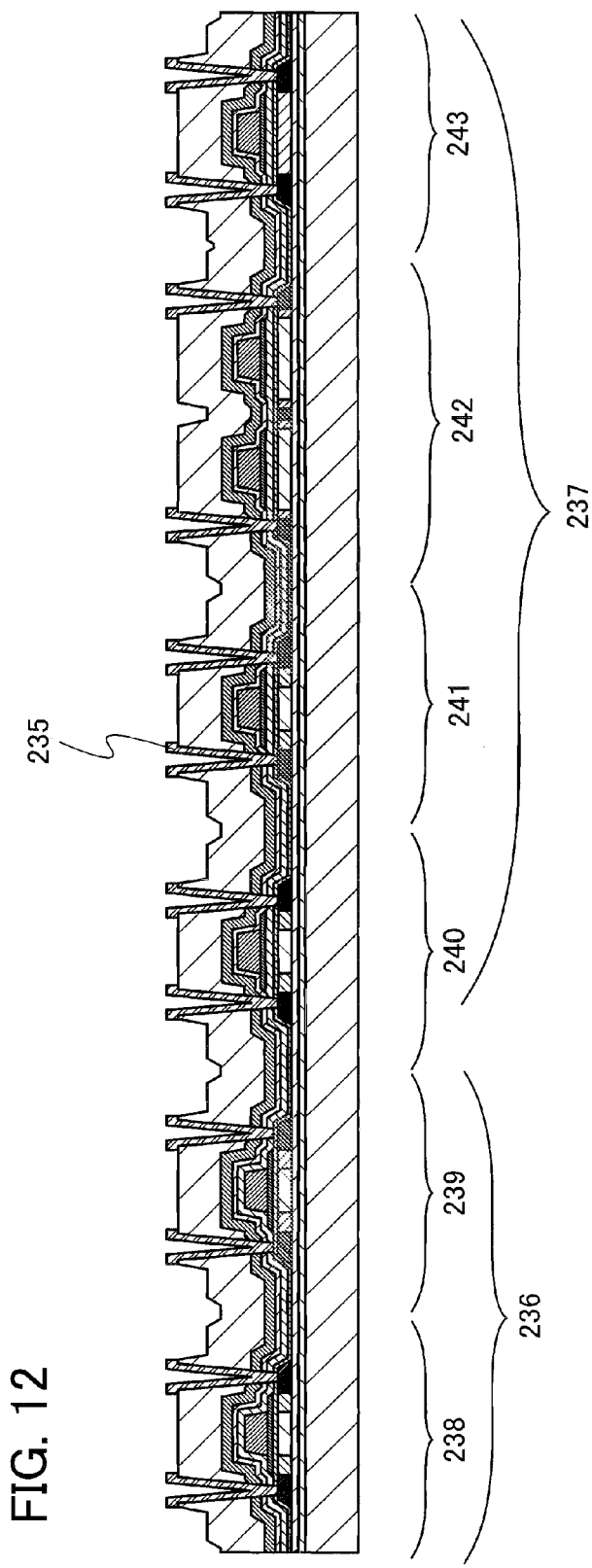
FIG. 12 is a cross-sectional view illustrating the method for manufacturing a transistor included in a display device of the present invention in Embodiment Mode 2.

Then, as illustrated in FIG. 11B, a plurality of opening portions 234 are selectively formed in parts for forming wirings 235, which are over the first p-type impurity regions 226 and the second n-type impurity regions 229. Further, as illustrated in FIG. 12, each of the wirings 235 is formed in contact with the first p-type impurity region 226 or the second n-type impurity region 229 in the semiconductor layers through each of the plurality of opening portions 234. In this embodiment mode, a first titanium layer is formed as the wiring 235, an aluminum layer is formed over the first titanium layer, and a second titanium layer is formed over the aluminum layer.

Thus, as illustrated in FIG. 12, a first p-channel transistor 238 and a first n-channel transistor 239 in a peripheral circuit portion 236, and a second p-channel transistor 240, a second n-channel transistor 241, a third n-channel transistor 242, and a capacitor 243 in a display portion 237 can be formed over one substrate.

The semiconductor layer of the first p-channel transistor 238 in the peripheral circuit portion 236 includes a channel formation region; the first p-type impurity regions 226 serving as a source and drain regions, which are provided in regions of the semiconductor layer, over which the electrode serving as a gate electrode is not formed; and the second p-type impurity regions 227 serving as low concentration impurity regions (LDD regions) in which impurity concentration is lower than that in the first p-type impurity regions 226, which are provided in regions of the semiconductor layer, over which the second conductive layer is not formed with the first conductive layer included in the electrode interposed therebetween and the first conductive layer included in the electrode is formed. The LDD regions are partially overlapped with the gate electrode.

The semiconductor layer of the first n-channel transistor 239 in the peripheral circuit portion 236 includes a channel formation region; the second n-type impurity regions 229 serving as a source and drain regions, which are provided in regions of the semiconductor layer, over which the electrode serving as a gate electrode is not formed; and the third n-type impurity regions 230 serving as low concentration impurity regions (LDD regions) in which impurity concentration is lower than that in the second n-type impurity regions 229, which are provided in regions of the semiconductor layer, over which the second conductive layer is not formed with the first conductive layer included in the electrode interposed therebetween and the first conductive layer included in the electrode is formed. The LDD regions are partially overlapped with the gate electrode.

The semiconductor layer of the second p-channel transistor 240 in the display portion 237 includes a channel formation region; the first p-type impurity regions 226 serving as a source and drain regions, which are provided in regions of the semiconductor layer, over which the electrode serving as a gate electrode is not formed; and the second p-type impurity regions 227 serving as low concentration impurity regions (LDD regions) in which impurity concentration is lower than that in the first p-type impurity regions 226, which are provided in regions of the semiconductor layer, over which the fourth conductive layer is not formed with the third conductive layer included in the electrode interposed therebetween and the third conductive layer included in the electrode is formed. The LDD regions are partially overlapped with the gate electrode.

The semiconductor layer of the second n-channel transistor 242 in the display portion 237 includes a channel formation region; the second n-type impurity regions 229 serving as a source and drain regions, which are provided in regions of the semiconductor layer, over which the electrode serving as a gate electrode is not formed; and the third n-type impurity regions 230 serving as low concentration impurity regions (LDD regions) in which impurity concentration is lower than that in the second n-type impurity regions 229, which are provided in regions of the semiconductor layer, over which the fourth conductive layer is not formed with the third conductive layer included in the electrode interposed therebetween and the third conductive layer included in the electrode is formed. The LDD regions are partially overlapped with the gate electrode.

The third n-channel transistor 242 in the display portion 237 includes a plurality of electrodes (the electrodes 221 and 222) serving as gate electrodes. The third n-channel transistor 242 is provided with the plurality of electrodes, so that an increase in off current of the transistor can be prevented. Further, the semiconductor layer of the third n-channel transistor 242 in the display portion 237 includes a channel formation region; the second n-type impurity regions 229 serving as a source and drain regions, which are provided in regions of the semiconductor layer, over which electrodes serving as gate electrodes are not formed; and the third n-type impurity regions 230 serving as low concentration impurity regions (LDD regions) in which impurity concentration is lower than that in the second n-type impurity regions 229. The LDD regions are not overlapped with the gate electrodes.

Note that a portion of the LDD region, which overlaps with the gate electrode, is referred to as an Lov region, and a portion of the LDD region, which does not overlap with the gate electrode, is referred to as an Loff region. Here, the Loff region is highly effective in suppressing an off current value, whereas it is not very effective in preventing degradation in an on current value due to hot carriers by alleviating an electric field in the vicinity of the drain. On the other hand, the Lov region is highly effective in preventing degradation in the on current value by alleviating the electric field in the vicinity of the drain, whereas it is not very effective in suppressing the off current value. Thus, it is preferable to form a transistor having a structure corresponding to characteristics required for each of the various circuits. For example, when being applied to the display device of the present invention, a transistor having an Loff region is preferably used as a switching transistor in a pixel portion in order to suppress the off current value. On the other hand, a transistor having an Lov region is preferably used as a transistor used for a peripheral circuit in order to prevent degradation in the on current value by relieving the electric field in the vicinity of the drain.

Note that the widths of the LDD regions of the transistors may differ from each other. The widths of the LDD regions are varied depending on characteristics of circuits, so that more accurate operation can be performed.

The capacitor 243 in the display portion 237 includes the semiconductor layer, the insulating layers, and the wirings and serves as an auxiliary capacitor of a pixel.

Thus, transistors each having the structure depending on characteristics of each circuit included in the display portion or the peripheral circuit portion can be formed over one substrate with the use of single crystal semiconductor materials for semiconductor layers.

Further, the gate insulating layer of the transistor used for the peripheral circuit portion is formed of one layer and the gate insulating layer of the transistor used for the display portion is formed of two layers, and thus gate electrodes are formed over different layers between the display portion and the peripheral circuit portion, whereby the gate insulating layer of the transistor used for the peripheral circuit portion can be reduced in thickness; for example, the gate insulating layer of the transistor used for an arithmetic circuit such as CPU can be reduced in thickness so that the arithmetic circuit can be operated at higher speed. Further, by performing doping treatment after the first gate insulating layer 209 and the second gate insulating layer 215 are provided, doping treatment can be uniformly performed on parts other than the parts over which the gate electrodes are formed.

Note that this embodiment mode can be combined with any of the other embodiment modes as appropriate.

Embodiment Mode 3

In this embodiment mode, the case of manufacturing the display device of the present invention is described with reference to FIGS. 15A and 15B. FIGS. 15A and 15B are cross-sectional views illustrating a method for manufacturing the display device of the present invention in this embodiment mode. Note that in this embodiment mode, dimensions different from actual dimensions are used for part or all of components in FIGS. 15A and 15B for convenience.

FIG. 15A is a cross-sectional view illustrating a top-emission display device which extracts light from the common electrode side. As illustrated in FIG. 15A, the top-emission display device has a peripheral circuit portion 300, a display portion 301, an insulating layer 308 provided over each transistor, a first electrode 309 provided so as to be in contact with an electrode of any of the transistors or an electrode of the capacitor 306 in the display portion 301 through an opening portion over the insulating layer 308, an insulating layer 310 provided over the first electrode 309 and the insulating layer 308, an electroluminescent layer 311 provided so as to be in contact with the first electrode 309 through the opening portion formed in the insulating layer 310, and a second electrode 312 provided so as to be in contact with the electroluminescent layer 311. The peripheral circuit portion 300 includes a first p-channel transistor 302 and a first n-channel transistor 303. The display portion 301 includes a second n-channel transistor 304, a third n-channel transistor 305 which serves as a switching transistor, a capacitor 306 which serves as an auxiliary capacitor, and a second p-channel transistor 307 which serves as a driving transistor. Note that each of the transistors of the peripheral circuit portion 300 and each of the transistors and the capacitor of the display portion 301 can be manufactured using the method illustrated in FIGS. 6A and 6B, FIGS. 7A and 7B, FIGS. 8A and 8B, FIGS. 9A and 9B, FIGS. 10A and 10B, FIGS. 11A and 11B, and FIG. 12.

The insulating layer 308 can be formed of a single layer of silicon oxynitride, silicon nitride oxide, or the like or a stack of the above. The insulating layer 308 serves as a planarization film.

The first electrode 309 can be formed using, for a conductive layer, a light-transmitting conductive oxide material such as indium tin oxide containing silicon oxide (ITSO), indium tin oxide (ITO), zinc oxide (ZnO), indium zinc oxide (IZO), or gallium-doped zinc oxide (GZO). Alternatively, a single-layer film containing one or more of titanium nitride, zirconium nitride, titanium, tungsten, nickel, platinum, chromium, silver, aluminum, and the like, a stack of a titanium nitride film and a film containing aluminum as a main component, a three-layer structure of a titanium nitride film, a film containing aluminum as a main component, and a titanium nitride film, or the like can be used for the conductive layer.

Note that a conductive layer to form the first electrode 309 may be formed using a conductive composition containing a conductive macromolecule (also referred to as a conductive polymer).

As the conductive macromolecule, a so-called π-electron conjugated conductive macromolecule can be used. For example, polyaniline or a derivative thereof, polypyrrole or a derivative thereof, polythiophene or a derivative thereof, and a copolymer of plural kinds of those materials can be given as the π-electron conjugated conductive macromolecule.

As specific examples of a conjugated conductive macromolecule, the following can be given: polypyrrole; poly(3-methylpyrrole); poly(3-butylpyrrole); poly(3-octylpyrrole); poly(3-decylpyrrole); poly(3-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-ethoxypyrrole); poly(3-octoxypyrrole); poly(3-carboxypyrrole); poly(3-methyl-4-carboxypyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxythiophene); poly(3-methyl-4-carboxythiophene); poly(3,4-ethylenedioxythiophene); polyaniline; poly(2-methylaniline); poly(2-octylaniline); poly(2-isobutylaniline); poly(3-isobutylaniline); poly(3-aniline sulfonic acid); poly(3-aniline sulfonic acid); and the like.

Any of the above conductive macromolecules may be used alone for the first electrode 309 as a conductive composition. Alternatively, any of the above conductive macromolecules can be used with an organic resin added thereto to adjust film characteristics such as uniformity of the thickness of a conductive composition film and the strength of the film.

As an organic resin, a thermosetting resin, a thermoplastic resin, a photocurable resin, or the like which is compatible with a conductive macromolecule or can be mixed and dispersed into a conductive macromolecule can be used. For example, a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as polyvinylidene fluoride, polyvinyl fluoride, polytetrafluoroethylene, ethylene-tetrafluoroethylene copolymer, or polychlorotrifluoroethylene; a vinyl resin such as polyvinyl alcohol, polyvinyl ether, polyvinyl butyral, polyvinyl acetate, or polyvinylchloride; an epoxy resin; a xylene resin; an aramid resin; a polyurethane-based resin; a polyurea-based resin; a melamine resin; a phenol-based resin; polyether; an acrylic-based resin; or a copolymer thereof can be used.

Further, a conductive composition may be doped with an acceptor dopant or a donor dopant so that an oxidation-reduction potential of a conjugated electron in a conjugated conductive macromolecule may be changed in order to adjust conductivity of the conductive composition.

As the acceptor dopant, a halogen compound, Lewis acid, proton acid, an organic cyano compound, an organometallic compound, or the like can be used. As the halogen compound, chlorine, bromine, iodine, iodine chloride, iodine bromide, iodine fluoride, and the like are given. As the Lewis acid, phosphorus pentafluoride, arsenic pentafluoride, antimony pentafluoride, boron trifluoride, boron trichloride, and boron tribromide, and the like are given. As the proton acid, inorganic acids such as hydrochloric acid, sulfuric acid, nitric acid, phosphoric acid, fluoroboric acid, hydrofluoric acid, and perchloric acid and organic acids such as organic carboxylic acid and organic sulfonic acid can be given. As the organic carboxylic acid and the organic sulfonic acid, the above-described carboxylic acid compounds and sulfonic acid compounds can be used, respectively. As the organic cyano compound, a compound in which two or more cyano groups are included in a conjugated bond can be used. For example, tetracyanoethylene, tetracyanoethylene oxide, tetracyanobenzene, tetracyanoquinodimethane, tetracyanoazanaphthalene, and the like are given.

As the donor dopant, alkali metal, alkaline-earth metal, a quaternary amine compound, or the like can be used.

A conductive composition may be dissolved in water or an organic solvent (e.g., an alcohol-based solvent, a ketone-based solvent, an ester-based solvent, a hydrocarbon-based solvent, or an aromatic-based solvent) so that a conductive layer which serves as the first electrode 309 can be formed by a wet process.

There is no particular limitation on the solvent in which the conductive composition is dissolved as long as the above-described conductive macromolecule and a macromolecule resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyl etyl ketone, methyl isobutyl ketone, toluene, and/or the like.

After the conductive composition is dissolved in a solvent as described above, a film thereof can be formed by a wet process such as an application method, a coating method, a droplet discharge method (also referred to as an ink-jet method), or a printing method. The solvent may be dried by thermal treatment or dried under reduced pressure. In the case where the organic resin is a thermosetting resin, thermal treatment may be further performed. In the case where the organic resin is a photo-curable resin, light irradiation treatment may be performed.

After the conductive film is formed, a surface thereof may be polished by a CMP method, cleaning with a polyvinyl alcohol-based porous body, or the like so as to be planarized.

The insulating layer 310 can be formed using an organic resin, an inorganic material, or a siloxane-based material. As the organic resin, acrylic, polyimide, polyamide, or the like can be used, and as the inorganic material, silicon oxide, silicon nitride oxide, or the like can be used. In particular, by using a photosensitive organic resin for the insulating layer 310 and forming an opening portion over the first electrode 309 so that side walls of the opening portion have inclined surfaces with consecutive curvature, the first electrode 309 and the second electrode 312 which is to be formed later can be prevented from being connected to each other. In this case, a mask can be formed by a droplet discharge method or a printing method. Alternatively, the insulating layer 310 itself may be formed by a droplet discharge method, a printing method, or the like.

Then, before the electroluminescent layer 311 is formed, thermal treatment under an atmosphere or thermal treatment under a vacuum atmosphere (vacuum bake) may be performed to remove moisture, oxygen, or the like adsorbed on the insulating layer 310 and the first electrode 309. Specifically, thermal treatment is performed at a substrate temperature of 200 to 450° C., preferably 250 to 300° C., for approximately 0.5 to 20 hours in a vacuum atmosphere. Pressure is desirably lower than or equal to $3 \times 10^{-7}$ Torr, more desirably lower than or equal to $3 \times 10^{-8}$ Torr if possible. Further, in the case where the electroluminescent layer 311 is formed after thermal treatment is performed in a vacuum atmosphere, reliability can be further improved by putting the substrate in the vacuum atmosphere until just before completion of formation of the electroluminescent layer 311. Further, the first electrode 309 may be irradiated with ultraviolet rays before or after the vacuum bake.

The electroluminescent layer 311 may be formed to have a single-layer structure or a layered structure and each layer thereof may contain an inorganic material in addition to an organic material. The luminescence of the electroluminescent layer 311 includes luminescence (fluorescence) at the time of returning from a singlet-excited state to a ground state and luminescence (phosphorescence) at the time of returning from a triplet-excited state to a ground state. In the case where the electroluminescent layer 311 is formed to have a plurality of layers and the first electrode 309 corresponds to a cathode, the electroluminescent layer 311 is formed by stacking an electron-injecting layer, an electron transporting layer, a light-emitting layer, a hole transporting layer, and a hole-injecting layer in this order over the first electrode 309. Note that in the case where the first electrode 309 corresponds to an anode, the electroluminescent layer 311 is formed by stacking a hole injecting layer, a hole transporting layer, a light-emitting layer, an electron-transporting layer, and an electron injecting layer in this order.

The electroluminescent layer 311 can be formed using any of a macromolecular organic compound, an intermolecular organic compound (which does not have a subliming property but has a molecular chain length of 10 μm or shorter), a low molecular organic compound, or an inorganic compound. Further, the electroluminescent layer 311 can be formed by a droplet discharge method. In the case of using an intermolecular organic compound, a low molecular organic compound, or an inorganic compound, the electroluminescent layer 311 may be formed by an evaporation method.

For the second electrode 312, metal, an alloy, an electrical conductive compound, or a mixture thereof, which has a small work function, or the like can generally be used. Specifically, alkali metal such as lithium (Li) or cesium (Cs), alkaline earth metal such as magnesium (Mg), calcium (Ca), or strontium (Sr), an alloy containing any of the above (Mg: Ag, Al:Li, or the like), or rare earth metal such as ytterbium (Yb) or erbium (Er) may be used. Alternatively, by forming a layer containing a material having a high electron injecting property so that it is in contact with the second electrode 312, a normal conductive film formed of aluminum (Al), a light-transmitting oxide conductive material, or the like may be used.

Thus, by being provided with the first electrode 309, the electroluminescent layer 311, and the second electrode 312 in the opening portion of the insulating layer 310, the light-emitting element 313 functions.

Note that after the light-emitting element 313 is formed, an insulating film may be formed over the second electrode 312. As the insulating film, used is a film which does not easily transmit a substance to be a factor encouraging deterioration of a light-emitting element, such as moisture or oxygen, as compared to the other insulating films. Typically, it is desirable to use a DLC film, a carbon nitride film, a silicon nitride film formed by an RF sputtering method, or the like. Alternatively, a stack of the film which does not easily transmit a substance such as moisture or oxygen and a film which easily transmits a substance such as moisture or oxygen as compared to the film may be used for the insulating film.

Further, the light-emitting element 313 is preferably packaged (sealed) with a cover material or a protective film (a laminate film, an ultraviolet curable resin film, or the like) having high airtightness and allowing little degasification in order not to be exposed to the air.

FIG. 15B is a cross-sectional view illustrating the structure of a bottom-emission display device which extracts light from the pixel electrode side of a light-emitting element. As illustrated in FIG. 15B, the bottom-emission display device has a peripheral circuit portion 300, a display portion 301, an insulating layer 310, and a light-emitting element 313 over one substrate. The peripheral circuit portion 300 includes a first p-channel transistor 302 and a first n-channel transistor 303. The display portion 301 includes a second n-channel transistor 304, a capacitor 306 which serves as an auxiliary capacitor, a third n-channel transistor 305 which serves as a switching transistor, and a second p-channel transistor 307 which serves as a driving transistor. The insulating layer 310 is provided over each transistor. The light-emitting element 313 includes a first electrode 309 provided so as to be in contact with one of electrodes of any of the transistors or an electrode of the capacitor in the display portion 301, an electroluminescent layer 311 provided so as to be in contact with the first electrode 309 through the opening portion formed in the insulating layer 310, and a second electrode 312 provided so as to be in contact with the electroluminescent layer 311. Note that each of the transistors of the peripheral circuit portion 300 and each of the transistors and the capacitor of the display portion 301 can be manufactured using the method illustrated in FIGS. 6A and 6B, FIGS. 7A and 7B, FIGS. 8A and 8B, FIGS. 9A and 9B, FIGS. 10A and 10B, FIGS. 11A and 11B, and FIG. 12.

Note that for the first electrode 309, the insulating layer 310, the electroluminescent layer 311, and the second electrode 312 in FIG. 15B, materials the same as or similar to those applicable to the first electrode 309, the insulating layer 310, the electroluminescent layer 311, and the second electrode 312 in FIG. 15A can be used.

Note that in the structure of FIG. 15B, light can also be extract from both of the first electrode 309 and the second electrode 312 of the light-emitting element 313. The materials and the thicknesses of the first electrode 309 and the second electrode 312 are selected depending on an intended structure. Further, in the case where light is extracted from the first electrode 309 side as in FIG. 15B, higher luminance can be achieved with lower power consumption, as compared to the case where light is extracted from the second electrode 312 side.

As described above, the transistors in the peripheral circuit portion and the display portion are formed over one substrate and the light-emitting element is further formed thereover, so that the display device of the present invention can be manufactured.

Note that this embodiment mode can be combined with any of the other embodiment modes as appropriate.

Embodiment Mode 4

In this embodiment mode, electronic appliances in each of which a display device of the present invention is used for a display panel will be described.

The display device of the present invention is used for a display panel of any of various electronic appliances. As electronic appliances to each of which the display device of the invention can be applied, there are cameras such as video cameras and digital cameras, goggle displays (head mounted displays), navigation systems, audio reproducing devices (car audios, audio components, and the like), laptop personal computers, game machines, mobile phones, portable information terminals (including mobile computers, portable game machines, electronic books, and devices each incorporating a computer and performing processing of a plurality of pieces of data to use a plurality of functions), image reproducing devices each provided with a recording medium (specifically, devices each of which is for reproducing a content of a recording medium such as a digital versatile disc (DVD) and has a display for displaying the reproduced image), and the like. Specific examples of the electronic appliances will be described with reference to FIGS. 16A to 16H and FIGS. 17A to 17C. FIGS. 16A to 16H and FIGS. 17A to 17C are diagrams illustrating these electronic appliances of this embodiment mode.

Figure 16A:
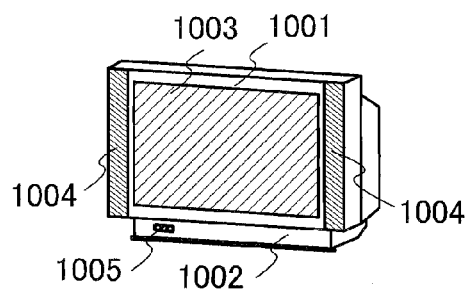
FIGS. 16A to 16H are diagrams each illustrating a structure of an electronic appliance having a display device of the present invention in Embodiment Mode 4 for a display portion.

FIG. 16A illustrates a display device which includes a housing 1001, a support base 1002, a display panel 1003, a speaker portion 1004, a video input terminal 1005, and the like. The display device of the present invention can be used for the display panel 1003. Note that the display device may be any display device for a personal computer, for TV broadcast reception, for advertisement display, or the like.

Figure 16B:
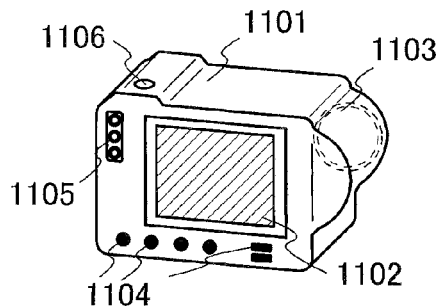

FIG. 16B illustrates a digital still camera which includes a main body 1101, a display panel 1102, an image receiving portion 1103, operation keys 1104, an external connecting port 1105, a shutter button 1106, and the like. The display device of the present invention can be used for the display panel 1102.

Figure 16C:
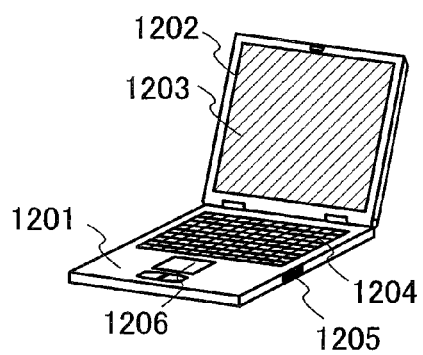

FIG. 16C illustrates a laptop personal computer which includes a main body 1201, a housing 1202, a display panel 1203, a keyboard 1204, an external connection port 1205, a pointing device 1206, and the like. The display device of the present invention can be used for the display panel 1203.

Figure 16D:
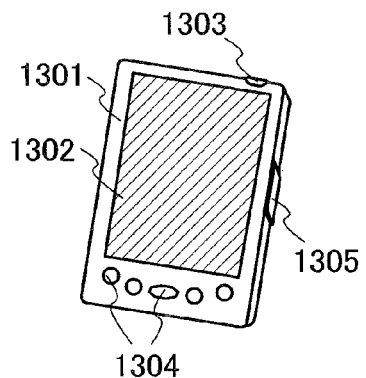

FIG. 16D illustrates a mobile computer which includes a main body 1301, a display panel 1302, a switch 1303, operation keys 1304, an infrared port 1305, and the like. The display device of the present invention can be used for the display panel 1302.

Figure 16E:
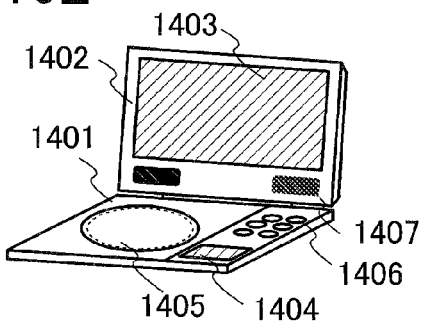

FIG. 16E illustrates a portable image reproducing device provided with a recording medium (specifically, a DVD reproducing device), which includes a main body 1401, a housing 1402, a display panel A 1403, a display panel B 1404, a recording medium (such as a DVD) reading portion 1405, an operation key 1406, a speaker portion 1407, and the like. The display panel A 1403 mainly displays image data, and the display panel B 1404 mainly displays text data. The display device of the present invention can be used for each of the display panels A 1403 and B 1404. Note that the image reproducing device provided with a recording medium also includes a home-use game machine and the like.

Figure 16F:
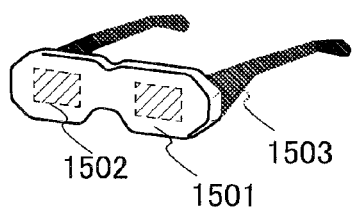

FIG. 16F illustrates a goggle display (head mounted display) which includes a main body 1501, a display panel 1502, and an arm portion 1503. The display device of the present invention can be used for the display panel 1502.

Figure 16G:
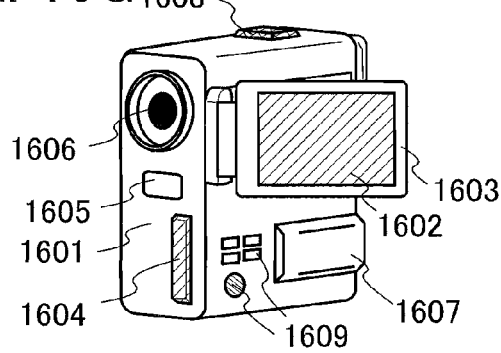

FIG. 16G illustrates a video camera which includes a main body 1601, a display panel 1602, a housing 1603, an external connection port 1604, a remote controller receiving portion 1605, an image receiving portion 1606, a battery 1607, an audio input portion 1608, operation keys 1609, and the like. The display device of the present invention can be used for the display panel 1602.

Figure 16H:
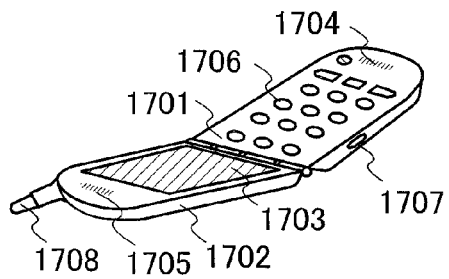

FIG. 16H illustrates a mobile phone which includes a main body 1701, a housing 1702, a display panel 1703, an audio input portion 1704, an audio output portion 1705, an operation key 1706, an external connecting port 1707, an antenna 1708, and the like. The display device of the present invention can be used for the display panel 1703. Note that white text is displayed against a black background on the display panel 1703 so that current consumption of the mobile phone can be reduced.

Figure 17A:
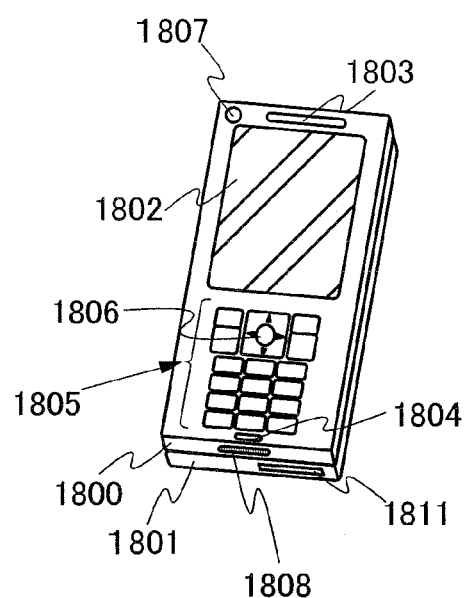
FIGS. 17A to 17C are diagrams illustrating a structure of an electronic appliance having a display device of the present invention in Embodiment Mode 4 for a display portion.
Figure 17B:
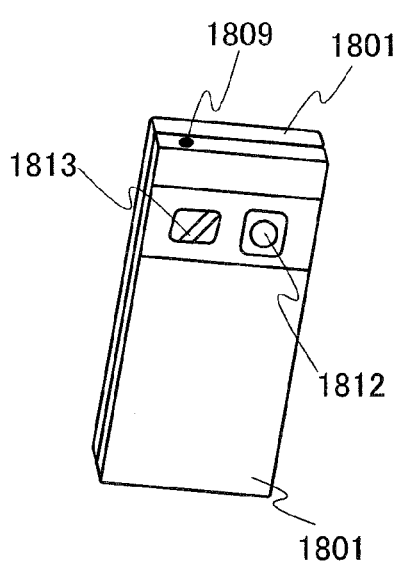
Figure 17C:
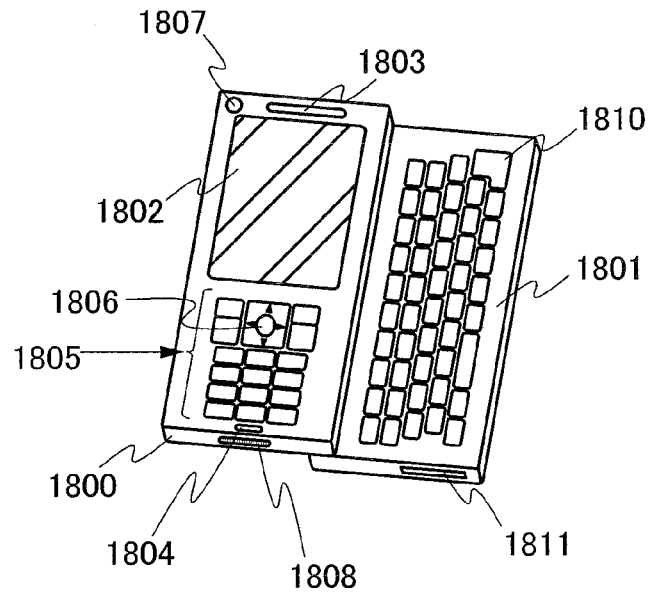

FIGS. 17A to 17C illustrate an example of a portable information terminal having a plurality of functions. FIG. 17A is a front diagram of the portable information terminal, FIG. 17B is a back diagram of the portable information terminal, and FIG. 17C is a development diagram of the portable information terminal. The portable information terminal whose example is illustrated in FIGS. 17A to 17C can have a plurality of functions. For example, such a portable information terminal can have a function of processing a variety of pieces of data by incorporating a computer, in addition to a telephone function.

The portable information terminal illustrated in FIGS. 17A to 17C is formed of a housing 1800 and a housing 1801. The housing 1800 includes a display panel 1802, a speaker 1803, a micro phone 1804, an operation key 1805, a pointing device 1806, a camera lens 1807, an external connection terminal 1808, and the like. The housing 1801 includes an earphone terminal 1809, a keyboard 1810, an external memory slot 1811, a camera lens 1812, a light 1813, and the like. Further, an antenna is incorporated in the housing 1801.

Further, in addition to the above structure, a noncontact IC chip, a small recording device, or the like may be incorporated.

The display device of the present invention can be used for the display panel 1802 and the direction of display is changed appropriately depending on an application mode. Further, the display device is provided with the camera lens 1807 on the same surface as the display panel 1802, and thus it can be used as a video phone. Further, a still image and a moving image can be taken with the camera lens 1812 and the light 1813 using the display panel 1802 as a viewfinder. The speaker 1803 and the microphone 1804 can be used for videophone calls, recording, and playing sound, etc. as well as voice calls. With use of the operation keys 1805, operation of incoming and outgoing calls, simple information input for electronic mail or the like, scrolling of a screen, cursor motion, and the like are possible. The housings 1801 and 1802 overlapped with each other (FIG. 17A) slide and can be developed as illustrated in FIG. 17C, so that the display device can be used as a portable information terminal. In this case, smooth operation is possible with use of the keyboard 1810 and the pointing device 1806. The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above-described functions, an infrared communication function, a television reception function, or the like may also be provided.

Thus, the display device of the present invention can be applied as a display panel of any of various electronic appliances described above. By using the display device of the present invention for a display panel, a low-power consumption electronic appliance whose circuit dimension is small can be provided.

Note that this embodiment mode can be combined with any of the other embodiment modes as appropriate.

Embodiment 1

In this embodiment, a display device including a display portion and a peripheral circuit portion which are formed over one substrate with the use of a single crystal semiconductor material will be described.

Figure 18:
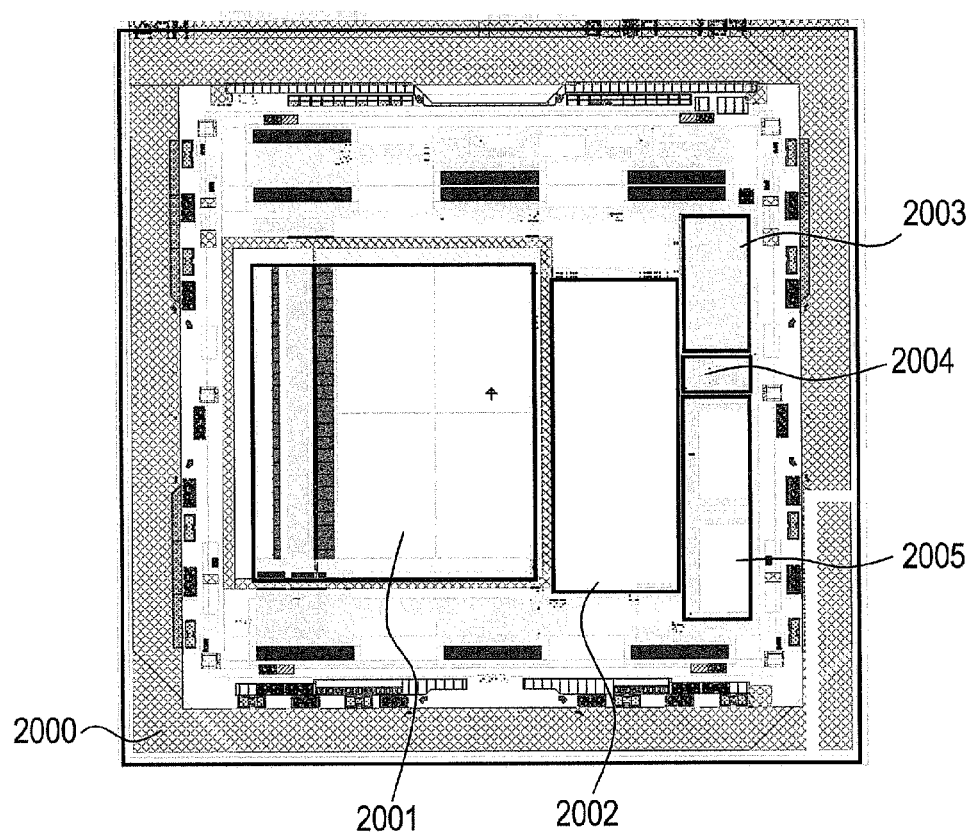
FIG. 18 is a top plan view illustrating a structure of a display device of the present invention in Embodiment 1.

The structure of the display device in this embodiment will be described with reference to FIG. 18. FIG. 18 is a top plan view illustrating the structure of the display device in this embodiment.

A display device 2000 of this embodiment, which is illustrated in FIG. 18, includes an OLED panel 2001, an image processing circuit 2002, a CPU 2003, a WRAM 2004, and a PROM 2005 over one substrate. Transistors used for these circuits are formed using single crystal semiconductor materials for semiconductor layers.

The main specification of the display device of this embodiment is shown in Table 1.

TABLE 1

| Specification of Peripheral Circuit Portion | | |
|---|---|---|
| CPU | Power Supply Voltage | 5 V |
| | Clock Frequency | 8 MHz |
| Image Processing Circuit | Power Supply Voltage | 5 V |
| | Clock Frequency | 4 MHz |
| Memory Circuit 1 | Power Supply Voltage | 10 V (Pre-charge Voltage 5.0 V) |
| PROM | Memory Size | 32 kbyte |
| | Response Time | W = 65 ns, R = 160 ns |
| Memory Circuit 2 | Power Supply Voltage | 5 V (Pre-charge Voltage 2.5 V) |
| WRAM | Memory Size | 64 byte |
| | Response Time | W = 65 ns, R = 160 ns |
| Specification of Display Portion | | |
| Source Driver | Driver Voltage | Logic System 5 V, Buffer System 16 V |
| | Gray Scale Method | 8 Gray Level, 256 colors |
| | Driving Method | Line-Sequential Driving |
| | Scan Direction Switching | Yes |
| Gate Driver | Driver Voltage | Logic System 5 V, Buffer System 16 V |
| | Driving Method | Shift Register Driving |
| | Scan Direction Switching | Yes |
| Pixel Structure | Screen Size | 2.6 inch |
| | Pixel Pitch | 76 × 228 μm |
| | Pixel Number | 240 × RGB × 160 |
| | Aperture Ratio | 57% (Bank 25μ)/63% (Bank 20μ) |
| | Type | Bottom Emission |
| | SW-TFT(L/W) | 4.5 μm × 2/3 μm (Loff: In side 1.5μ/Out side 2μ) |
| | DR-TFT(L/W) | 143 μm/5.5 μm |
| | Bank Width | Left, Right, Top, Bottom 25 μm (20 μm acceptable) |

The channel length L of a driving transistor in a pixel in this case was obtained as follows using the formulae in Embodiment Mode 1.

When calculated in consideration of the specification of the display device under the condition that $I_{ds}$ is 0.2 μA, μ is 122 cm$^2$/V$_s$, $C_{ox}$ is 4.53×10$^{-16}$ F/μm$^2$, and $V_{th}$ is 2 V in Formula 2, the channel length L of the driving transistor was approximately 143 μm.

Thus, the display device including circuits included in a display portion and a peripheral circuit portion, which are formed over one substrate with the use of a single crystal semiconductor material, can be manufactured. By setting the channel length L of the driving transistor in a pixel to the above value, display can be performed while the value of an on current is controlled to be the value in the range suitable for the display device of the present invention.

This application is based on Japanese Patent Application serial no. 2007-310788 filed with Japan Patent Office on Nov. 30, 2007, the entire contents of which are hereby incorporated by reference.

What is claimed is:

1. A display device comprising:
a substrate;
a display portion comprising:
   a pixel comprising:
      a first transistor; and
      a pixel electrode;
   a scan line driver circuit connected to the pixel;
   a signal line driver circuit connected to the pixel; and
   a power supply circuit electrically connected to the pixel electrode via the first transistor; and
a peripheral circuit portion comprising a second transistor,
wherein the first transistor comprises:
   a first single crystal semiconductor layer formed over the substrate with a bonding layer interposed therebetween; and
   a first gate electrode formed over the first single crystal semiconductor layer with a first gate insulating layer interposed therebetween,
wherein the second transistor comprises:
   a second single crystal semiconductor layer formed over the substrate with the bonding layer interposed therebetween; and
   a second gate electrode formed over the second single crystal semiconductor layer with a second gate insulating layer interposed therebetween,
wherein the peripheral circuit portion comprises an arithmetic circuit, an image processing circuit, and a memory circuit,
wherein the second transistor is comprised in any one of the arithmetic circuit, the image processing circuit, and the memory circuit,
wherein the pixel has a longer side and a shorter side,
wherein a channel length direction of the first transistor is parallel to the longer side, and
wherein 143≤L≤AX (0<A≤0.7, X≥204) is satisfied under a condition that a channel length of the first transistor is L μm and a length of the longer side is X μm.

2. The display device according to claim 1,
wherein the first transistor further comprises a third gate insulating layer interposed between the first gate insulating layer and the first gate electrode.

3. The display device according to claim 1,
wherein the first transistor is driven so that $|V_{ds}|≥|V_{gs}|-|V_{th}|$ is satisfied, under a condition that a voltage applied between the first gate electrode and a source terminal of the first transistor is $V_{gs}$, a voltage applied between the source terminal and a drain terminal is $V_{ds}$, and a threshold voltage of the first transistor is $V_{th}$.

4. A display device comprising:
a substrate;
a display portion comprising:
   a pixel comprising:
      a first transistor; and
      a pixel electrode;
   a scan line driver circuit connected to the pixel;
   a signal line driver circuit connected to the pixel; and
   a power supply circuit electrically connected to the pixel electrode via the first transistor; and
a peripheral circuit portion comprising a second transistor,
wherein the first transistor comprises:
   a first single crystal semiconductor layer formed over the substrate with a bonding layer interposed therebetween; and
   a first gate electrode formed over the first single crystal semiconductor layer with a first gate insulating layer interposed therebetween,
wherein the second transistor comprises:
   a second single crystal semiconductor layer formed over the substrate with the bonding layer interposed therebetween; and
   a second gate electrode formed over the second single crystal semiconductor layer with a second gate insulating layer interposed therebetween,
wherein the pixel has a longer side and a shorter side,
wherein a channel length direction of the first transistor is parallel to the longer side, and
wherein 143≤L≤AX (0<A≤0.7, X≥204) is satisfied under a condition that a channel length of the first transistor is L μm and a length of the longer side is X μm.

5. The display device according to claim 4,
wherein the first transistor further comprises a third gate insulating layer interposed between the first gate insulating layer and the first gate electrode.

6. The display device according to claim 4,
wherein the first transistor is driven so that $|V_{ds}|≥|V_{gs}|-|V_{th}|$ is satisfied, under a condition that a voltage applied between the first gate electrode and a source terminal of the first transistor is $V_{gs}$, a voltage applied between the source terminal and a drain terminal is $V_{ds}$, and a threshold voltage of the first transistor is $V_{th}$.

7. The display device according to claim 4,
wherein the peripheral circuit portion comprises an arithmetic circuit, an image processing circuit, and a memory circuit, and
wherein the second transistor is comprised in any one of the arithmetic circuit, the image processing circuit, and the memory circuit.

8. The display device according to claim 4,
wherein the pixel further comprises:
   an electroluminescent layer formed over the pixel electrode; and
   a first electrode formed over the electroluminescent layer, and
wherein an amount of current flowing through the electroluminescent layer is larger than or equal to 0.1 μA and smaller than or equal to 1.0 μA.

9. A display device comprising:
a substrate;
a display portion comprising:
   a pixel comprising:
      a first transistor; and
      a pixel electrode;

a scan line driver circuit connected to the pixel; and
a signal line driver circuit connected to the pixel; and
a peripheral circuit portion comprising a second transistor,
wherein the first transistor comprises:
- a first single crystal semiconductor layer formed over the substrate with a bonding layer interposed therebetween; and
- a first gate electrode formed over the first single crystal semiconductor layer with a first gate insulating layer interposed therebetween, wherein the second transistor comprises:
- a second single crystal semiconductor layer formed over the substrate with the bonding layer interposed therebetween; and
- a second gate electrode formed over the second single crystal semiconductor layer with a second gate insulating layer interposed therebetween, wherein the pixel has a longer side and a shorter side,
wherein a channel length direction of the first transistor is parallel to the longer side, and
wherein $143 \leq L \leq AX$ ($0 < A \leq 0.7$, $X \geq 204$) is satisfied under a condition that a channel length of the first transistor is L μm and a length of the longer side is X μm.

10. The display device according to claim 9,
wherein the first transistor further comprises a third gate insulating layer interposed between the first gate insulating layer and the first gate electrode.

11. The display device according to claim 9,
wherein the first transistor is driven so that $|V_{ds}| \geq |V_{gs}| - |V_{th}|$ is satisfied, under a condition that a voltage applied between the first gate electrode and a source terminal of the first transistor is $V_{gs}$, a voltage applied between the source terminal and a drain terminal is $V_{ds}$, and a threshold voltage of the first transistor is $V_{th}$.

12. The display device according to claim 9,
wherein the peripheral circuit portion comprises an arithmetic circuit, an image processing circuit, and a memory circuit, and
wherein the second transistor is comprised in any one of the arithmetic circuit, the image processing circuit, and the memory circuit.

13. The display device according to claim 9,
wherein the pixel further comprises:
- an electroluminescent layer formed over the pixel electrode; and
- a first electrode formed over the electroluminescent layer, and wherein an amount of current flowing through the electroluminescent layer is larger than or equal to 0.1 μA and smaller than or equal to 1.0 μA.

* * * * *